(12) United States Patent
Choi et al.

(10) Patent No.: US 9,665,003 B2
(45) Date of Patent: May 30, 2017

(54) HARDMASK COMPOSITION, METHOD OF FORMING PATTERNS USING THE HARDMASK COMPOSITION AND SEMICONDUCTOR INTEGRATED CIRCUIT DEVICE INCLUDING THE PATTERNS

(71) Applicants: Yoo-Jeong Choi, Uiwang-si (KR); Yun-Jun Kim, Uiwang-si (KR); Go-Un Kim, Uiwang-si (KR); Young-Min Kim, Uiwang-si (KR); Hea-Jung Kim, Uiwang-si (KR); Joon-Young Moon, Uiwang-si (KR); Yo-Choul Park, Uiwang-si (KR); Yu-Shin Park, Uiwang-si (KR); You-Jung Park, Uiwang-si (KR); Hyun-Ji Song, Uiwang-si (KR); Seung-Wook Shin, Uiwang-si (KR); Yong-Woon Yoon, Uiwang-si (KR); Chung-Heon Lee, Uiwang-si (KR); Seung-Hee Hong, Uiwang-si (KR)

(72) Inventors: Yoo-Jeong Choi, Uiwang-si (KR); Yun-Jun Kim, Uiwang-si (KR); Go-Un Kim, Uiwang-si (KR); Young-Min Kim, Uiwang-si (KR); Hea-Jung Kim, Uiwang-si (KR); Joon-Young Moon, Uiwang-si (KR); Yo-Choul Park, Uiwang-si (KR); Yu-Shin Park, Uiwang-si (KR); You-Jung Park, Uiwang-si (KR); Hyun-Ji Song, Uiwang-si (KR); Seung-Wook Shin, Uiwang-si (KR); Yong-Woon Yoon, Uiwang-si (KR); Chung-Heon Lee, Uiwang-si (KR); Seung-Hee Hong, Uiwang-si (KR)

(73) Assignee: Cheil Industries, Inc., Gumi-Si, Kyeongsangbuk-do (KR)

( * ) Notice: Subject to any disclaimer, the term of this patent is extended or adjusted under 35 U.S.C. 154(b) by 0 days.

(21) Appl. No.: 14/263,323

(22) Filed: Apr. 28, 2014

(65) Prior Publication Data
US 2015/0004531 A1  Jan. 1, 2015

(30) Foreign Application Priority Data

Jun. 27, 2013 (KR) .................. 10-2013-0074687
Jun. 27, 2013 (KR) .................. 10-2013-0074689

(51) Int. Cl.
G03F 7/09  (2006.01)
G03F 7/40  (2006.01)
G03F 7/11  (2006.01)
G03F 7/30  (2006.01)
(Continued)

(52) U.S. Cl.
CPC ............. *G03F 7/094* (2013.01); *G03F 7/09* (2013.01); *G03F 7/091* (2013.01); *G03F 7/11* (2013.01); *G03F 7/162* (2013.01); *G03F 7/30* (2013.01); *G03F 7/36* (2013.01); *G03F 7/40* (2013.01)

(58) Field of Classification Search
None
See application file for complete search history.

(56) References Cited

U.S. PATENT DOCUMENTS

2008/0305441 A1* 12/2008 Yoon et al. ................ 430/323
2010/0021830 A1*  1/2010 Kim et al. .................... 430/5
(Continued)

FOREIGN PATENT DOCUMENTS

| CN | 101641390 A | 2/2010 |
|---|---|---|
| CN | 101681096 A | 3/2010 |
| CN | 102115426 A | 7/2011 |

(Continued)

OTHER PUBLICATIONS

Taiwanese Search Report dated Sep. 18, 2015 in Corresponding Taiwanese Patent Application No. 103106366.

(Continued)

*Primary Examiner* — Sin Lee
(74) *Attorney, Agent, or Firm* — Lee & Morse, P.C.

(57) ABSTRACT

A hardmask composition includes a monomer represented by the following Chemical Formula 1, a polymer including a moiety represented by the following Chemical Formula 2, a polymer including a moiety represented by the following Chemical Formula 3, or a combination thereof, and a solvent,

[Chemical Formula 1]

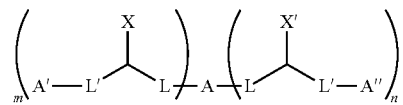

[Chemical Formula 2]

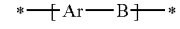

[Chemical Formula 3]

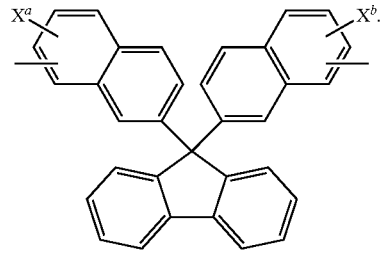

18 Claims, No Drawings

(51) Int. Cl.
*G03F 7/16* (2006.01)
*G03F 7/36* (2006.01)

(56) References Cited

U.S. PATENT DOCUMENTS

| | | | | |
|---|---|---|---|---|
| 2011/0155944 A1* | 6/2011 | Cho et al. | ............... | 252/62.51 R |
| 2012/0153511 A1* | 6/2012 | Song | ................. | H01L 21/02118 |
| | | | | 257/786 |

FOREIGN PATENT DOCUMENTS

| | | |
|---|---|---|
| CN | 102566281 A | 7/2012 |
| JP | 62-252734 A | 11/1987 |
| JP | 2001-098358 A | 4/2001 |
| JP | 2002-174904 A | 6/2002 |
| JP | 2004-158709 A | 6/2004 |
| JP | 2010-122656 A | 6/2010 |
| JP | 2010-524224 A | 7/2010 |
| JP | 2010-271654 A | 12/2010 |
| JP | 2011-107684 A | 6/2011 |
| JP | 2012-001687 A | 1/2012 |
| KR | 10-2002-0013815 A | 2/2002 |
| KR | 10-2007-0002602 A | 1/2007 |
| KR | 10-0908601 B1 | 7/2009 |
| KR | 100930673 B1 | 12/2009 |
| KR | 10-2010-0072660 A | 7/2010 |
| KR | 10-2011-0079201 A | 7/2011 |
| KR | 2011-0086812 A | 8/2011 |
| KR | 10-2012-0067602 A | 6/2012 |
| KR | 10-2012-0068379 A | 6/2012 |
| KR | 10-2012-0073817 A | 7/2012 |
| KR | 2012-0073819 A | 7/2012 |
| KR | 2012-0077466 A | 7/2012 |
| KR | 10-1257697 B1 | 4/2013 |
| KR | 10-2013-0078432 A | 7/2013 |
| TW | 200906890 A | 2/2009 |

OTHER PUBLICATIONS

Provisional double patenting rejection over claims of the above-identified application; USPTO Office action mailed Mar. 30, 2016, in U.S. Appl. No. 14/364,829.
Chinese Search Report dated Sep. 5, 2016 in Corresponding Chinese Patent Application No. 201410063061.2.

* cited by examiner

HARDMASK COMPOSITION, METHOD OF FORMING PATTERNS USING THE HARDMASK COMPOSITION AND SEMICONDUCTOR INTEGRATED CIRCUIT DEVICE INCLUDING THE PATTERNS

CROSS-REFERENCE TO RELATED APPLICATION

Korean Patent Application Nos. 10-2013-0074687 and 10-2013-0074689, each filed on Jun. 27, 2013, in the Korean Intellectual Property Office, and entitled: "Hardmask Composition, Method Of Forming Patterns Using The Hardmask Composition And Semiconductor Integrated Circuit Device Including The Patterns Including The Patterns," are incorporated by reference herein in their entirety.

BACKGROUND

1. Field

Embodiments relate to a hardmask composition, a method of forming a pattern using the same, and a semiconductor integrated circuit device including the pattern.

2. Description of the Related Art

Recently, the semiconductor industry has developed ultrafine techniques for forming patterns of several to several tens of nanometers in size. Such ultrafine techniques use lithographic techniques.

SUMMARY

Embodiments are directed to a hardmask composition including a monomer represented by the following Chemical Formula 1, a polymer including a moiety represented by the following Chemical Formula 2, a polymer including a moiety represented by the following Chemical Formula 3, or a combination thereof, and a solvent.

[Chemical Formula 1]

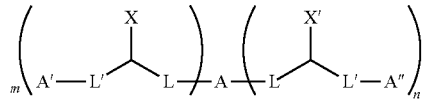

In Chemical Formula 1,

A may be a substituted or unsubstituted aromatic ring group, a substituted or unsubstituted aliphatic cyclic group, a substituted or unsubstituted C1 to C20 alkylene group, a substituted or unsubstituted C2 to C20 alkenylene group, a substituted or unsubstituted C2 to C20 alkynylene group, or a combination thereof, A' and A" may independently be a substituted or unsubstituted aromatic ring group, a substituted or unsubstituted aliphatic cyclic group, or a combination thereof, X and X' may independently be a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof, L and L' may independently be a single bond, a substituted or unsubstituted C1 to C20 alkylene group, a substituted or unsubstituted C6 to C30 arylene group, or a combination thereof, and m and n may independently be integers of greater than or equal to 0, and 1≤m+n≤(a maximum number of a substituent of A).

[Chemical Formula 2]

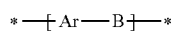

In Chemical Formula 2,

Ar may be a substituted or unsubstituted aromatic group selected from the following Group 1, and B may be one or a combination of two or more selected from the following Group 2.

[Group 1]

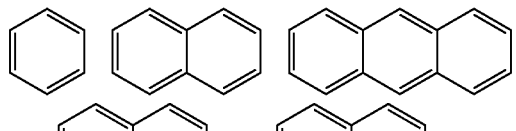

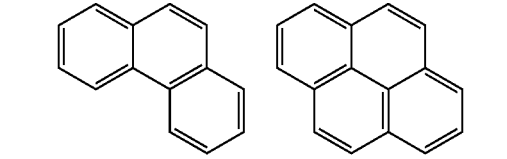

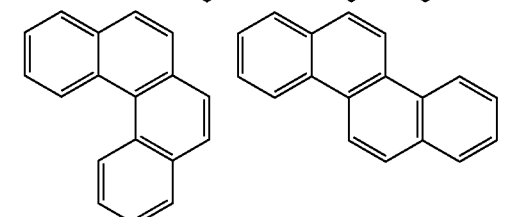

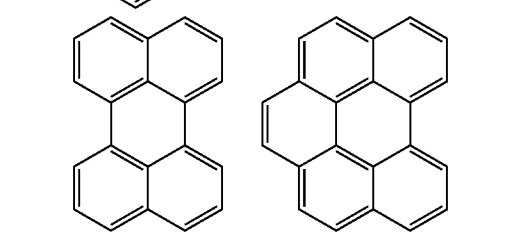

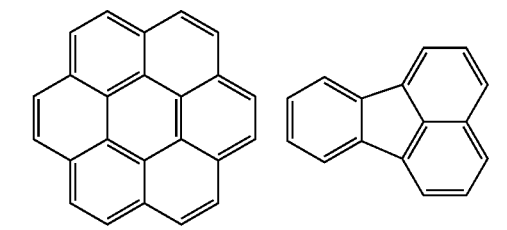

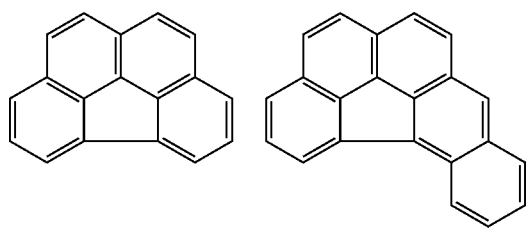

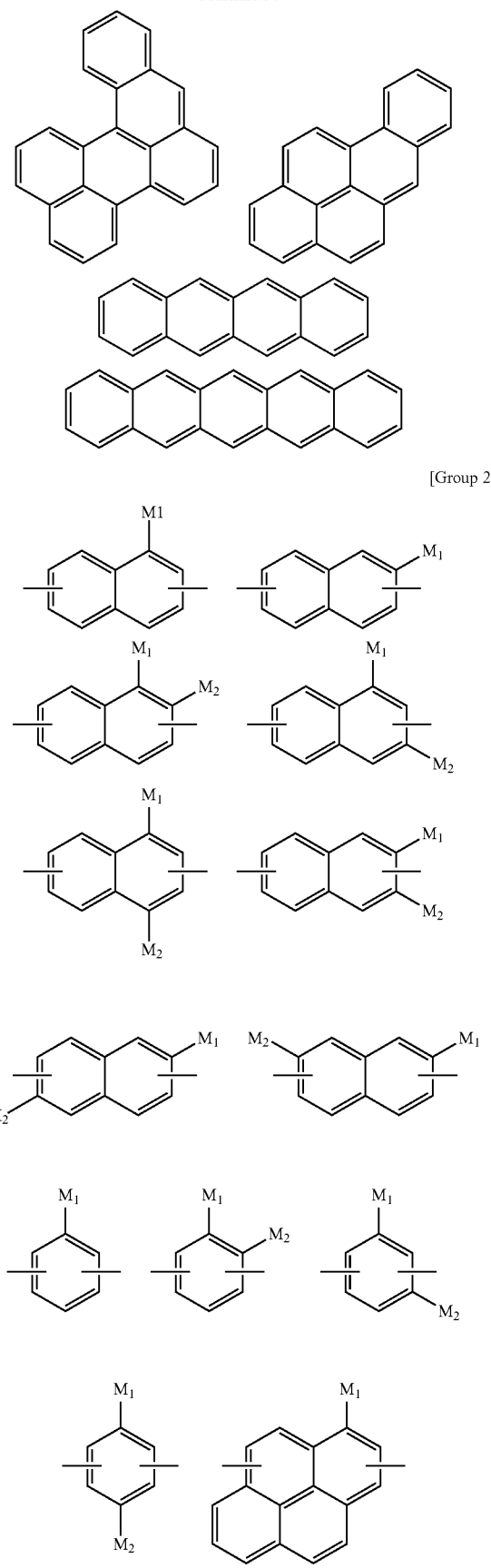
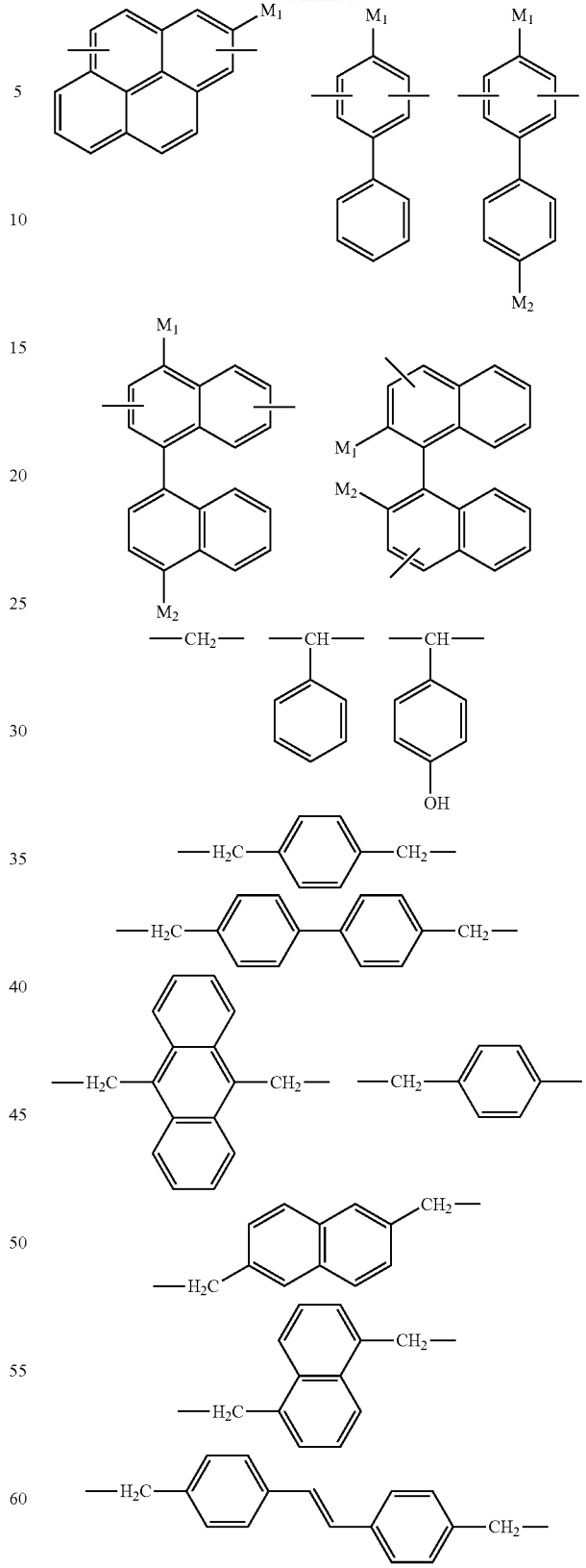
[Group 2]
In the Group 2, $M^1$ and $M^2$ may independently be hydrogen, a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

[Chemical Formula 3]

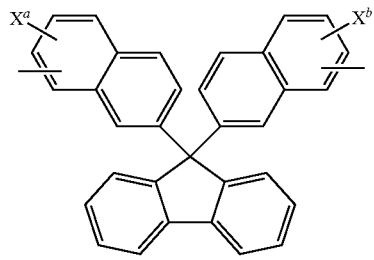

In Chemical Formula 3, $X^a$ and $X^b$ may independently be a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

A, A', and A" may independently be a substituted or unsubstituted cyclic group selected from the following Group 3.

[Group 3]

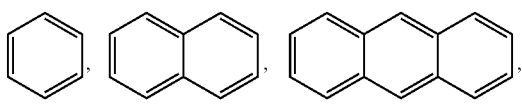

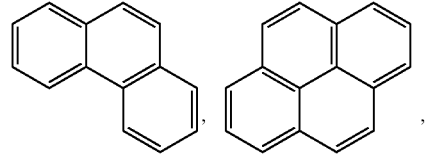

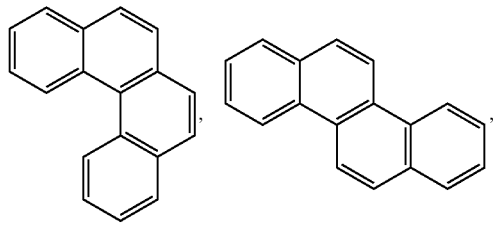

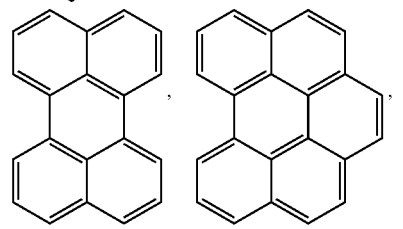

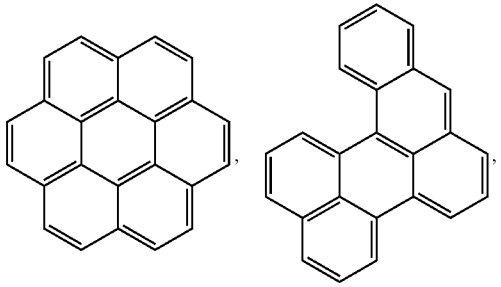

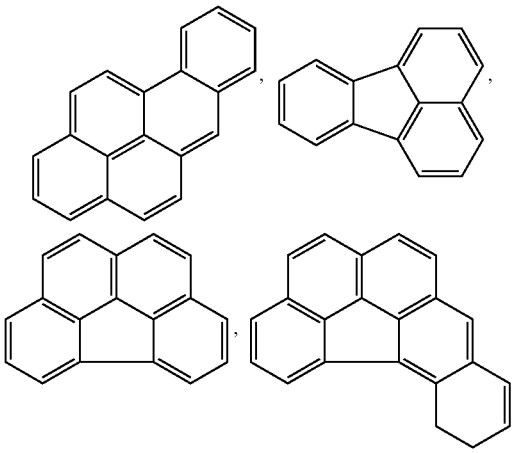

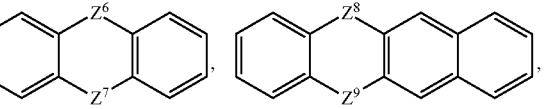

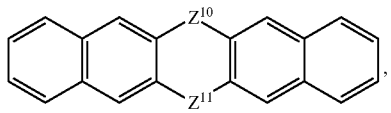

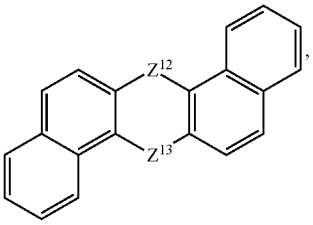

-continued

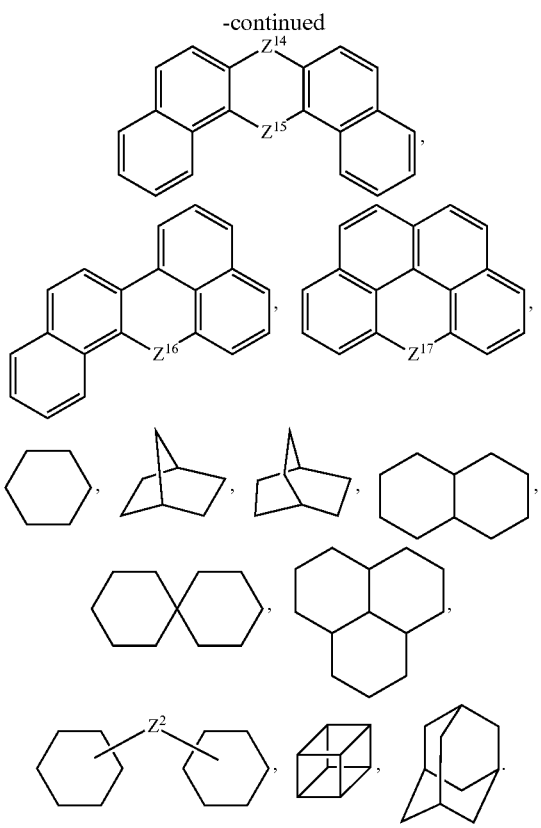

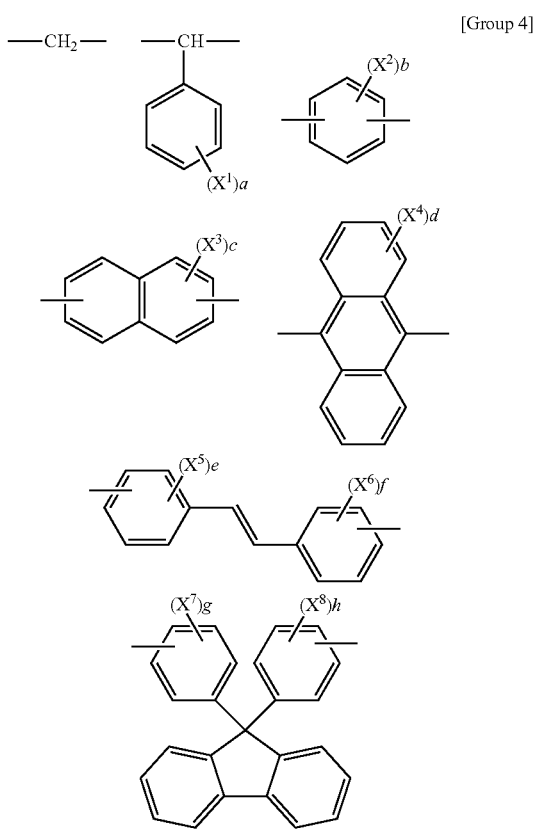

In the Group 3, $Z^1$ and $Z^2$ may independently be a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, $NR^a$, oxygen (O), sulfur (S), or a combination thereof, wherein $R^a$ is hydrogen, a substituted or unsubstituted C1 to C10 alkyl group, a halogen atom, or a combination thereof, $Z^3$ to $Z^{17}$ may independently be C=O, $NR^a$, oxygen (O), sulfur (S), $CR^bR^c$, or a combination thereof, wherein $R^a$ to $R^c$ are independently hydrogen, a substituted or unsubstituted C1 to C10 alkyl group, a halogen atom, a halogen-containing group, or a combination thereof.

At least one of the A, A', and A" may be a polycyclic aromatic group.

At least one hydrogen of the A, A', or A" may be substituted with a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

In Chemical Formula 2, at least one hydrogen of Ar may be substituted with a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

The polymer including the moiety represented by Chemical Formula 3 may further include a moiety of one or a combination of two or more selected from the following Group 4.

[Group 4]

—CH$_2$—   —CH—

In the Group 4, $X^1$ to $X^8$ may independently be a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof, and a to h may independently be integers of 0 to 4.

The monomer may be represented by one of the following Chemical Formulae 1a to 1h.

[Chemical Formula 1a]

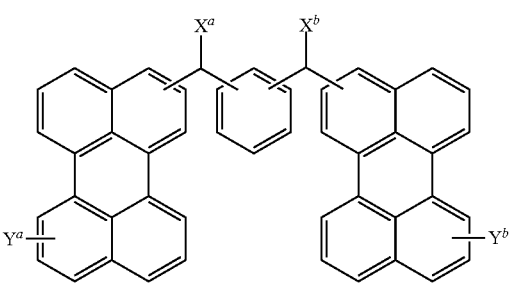

[Chemical Formula 1b]

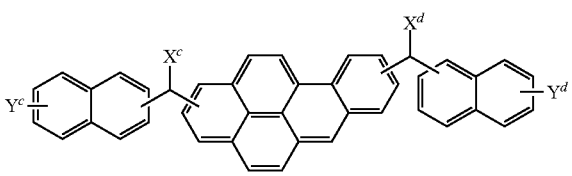

[Chemical Formula 1c]

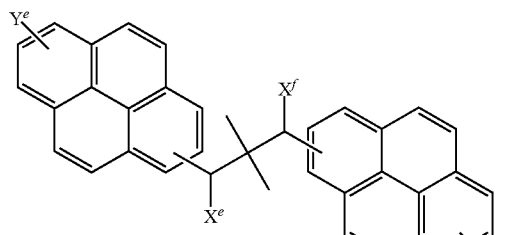

[Chemical Formula 1d]

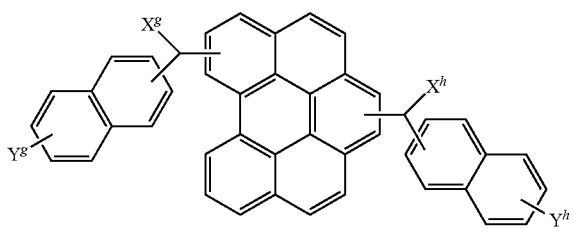

[Chemical Formula 1e]

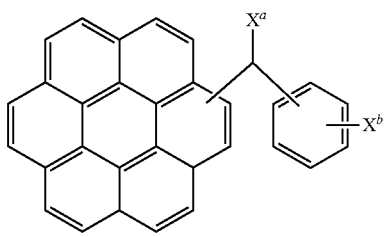

[Chemical Formula 1f]

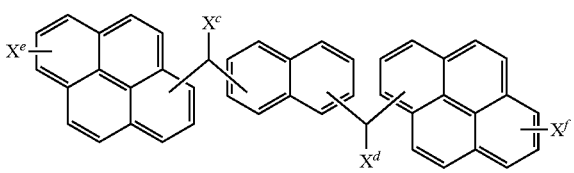

[Chemical Formula 1g]

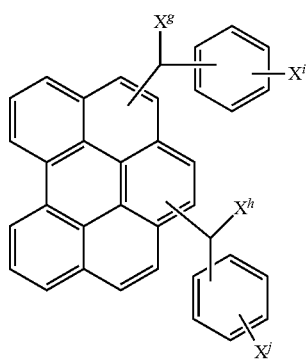

[Chemical Formula 1h]

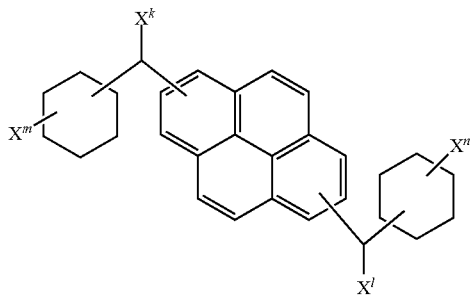

In Chemical Formulae 1a to 1h, $X^a$ to $X^n$ and $Y^a$ to $Y^h$ may independently be a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

The monomer may have a molecular weight of about 200 to about 5,000.

The polymer including the moiety represented by Chemical Formula 2 and the polymer including the moiety represented by Chemical Formula 3 may each have a weight average molecular weight of about 500 to about 10,000.

A weight ratio of the monomer and the polymer may be about 9:1 to about 1:9.

The solvent may include at least one selected from propylene glycol monomethylether acetate (PGMEA), propylene glycol monomethylether (PGME), cyclohexanone, and ethyl lactate.

The monomer and the polymer may be included in an amount of about 0.1 parts by weight to about 50 parts by weight, based on 100 parts by weight of the solvent.

Embodiments are also directed to a method of forming a pattern, the method including providing a material layer on a substrate, applying the hardmask composition on the material layer, heat-treating the hardmask composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The hardmask composition may be applied using a spin-on coating method.

The process of forming a hardmask layer may include heat-treating at about 100° C. to about 500° C.

The method may further include forming a bottom anti-reflective coating (BARC) on the silicon-containing thin layer.

The silicon-containing thin layer may include silicon oxynitride (SiON).

Embodiments are also directed to a semiconductor integrated circuit device including a pattern formed using a method according to an embodiment.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

As used herein, when a definition is not otherwise provided, the term 'substituted' may refer to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C7 to C30 arylalkyl group, a substituted or unsubstituted C1 to C20 alkylborane group, a substituted or unsubstituted C6 to C30 arylborane group, a C1 to C4 alkoxy group, a C1 to C20 heteroalkyl group, a C3 to C20 heteroarylalkyl group, C3 to C30 cycloalkyl group, a C3 to C15 cycloalkenyl group, a C6 to C15 cycloalkynyl group, a C2 to C30 heterocycloalkyl group, and a combination thereof, instead of a hydrogen atom of a compound.

As used herein, when a definition is not otherwise provided, the term 'hetero' refers to one including 1 to 3 heteroatoms selected from B, N, O, S, and P.

Hereinafter, a hardmask composition according to an example embodiment is described.

The hardmask composition according to the present example embodiment includes a monomer represented by the following Chemical Formula 1, a polymer including a moiety represented by the following Chemical Formula 2, a polymer including a moiety represented by the following Chemical Formula 3, or a combination thereof, and a solvent.

[Chemical Formula 1]

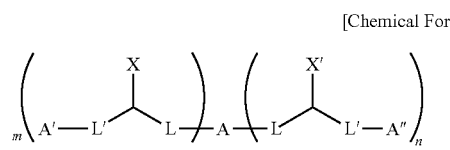

According to the present example embodiment, in Chemical Formula 1,

A is a substituted or unsubstituted aromatic ring group, a substituted or unsubstituted aliphatic cyclic group, a substituted or unsubstituted C1 to C20 alkylene group, a substituted or unsubstituted C2 to C20 alkenylene group, a substituted or unsubstituted C2 to C20 alkynylene group, or a combination thereof, A' and A" are independently a substituted or unsubstituted aromatic ring group, a substituted or unsubstituted aliphatic cyclic group, or a combination thereof, X and X' are independently a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof, L and L' are independently a single bond, a substituted or unsubstituted C1 to C20 alkylene group, a substituted or unsubstituted C6 to C30 arylene group, or a combination thereof, and m and n are independently integers of greater than or equal to 0, and 1≤m+n≤(a maximum number of a substituent of A).

[Chemical Formula 2]

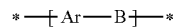

According to the present example embodiment, in Chemical Formula 2,

Ar is a substituted or unsubstituted aromatic group selected from the following Group 1, and B is one or a combination of two or more selected from the following Group 2.

[Group 1]

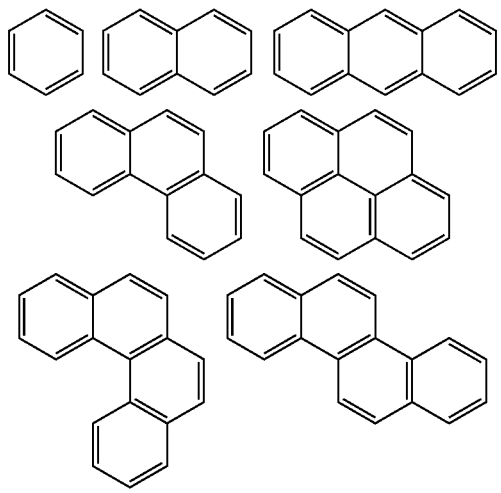

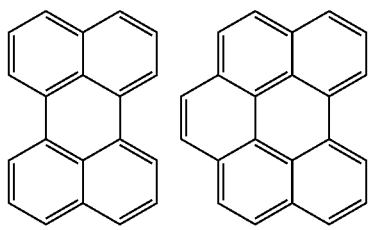

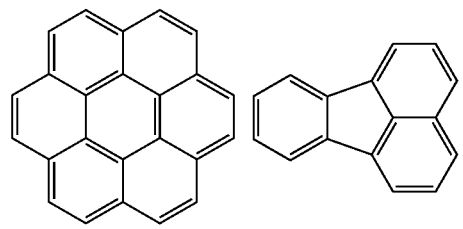

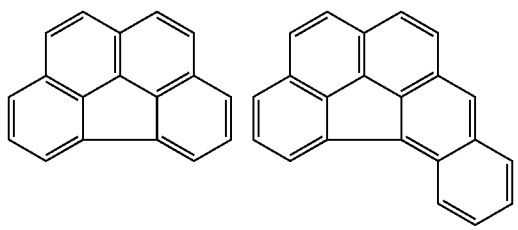

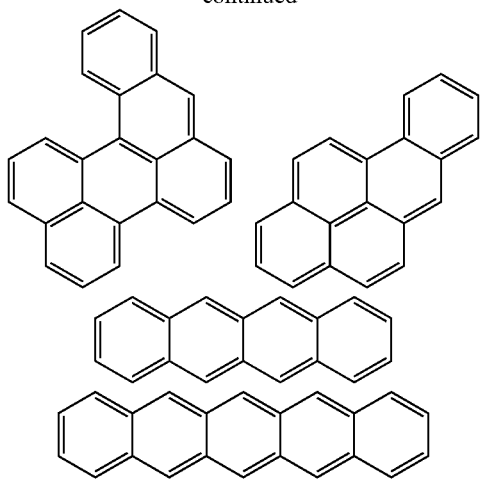
In the Group 1, binding positions of each ring are not particularly limited, and each ring may be substituted or unsubstituted. When the rings listed in the Group 1 are substituted rings, they may be substituted with, for example a C1 to C20 alkyl group, a halogen atom, a hydroxy group, etc.
[Group 2]
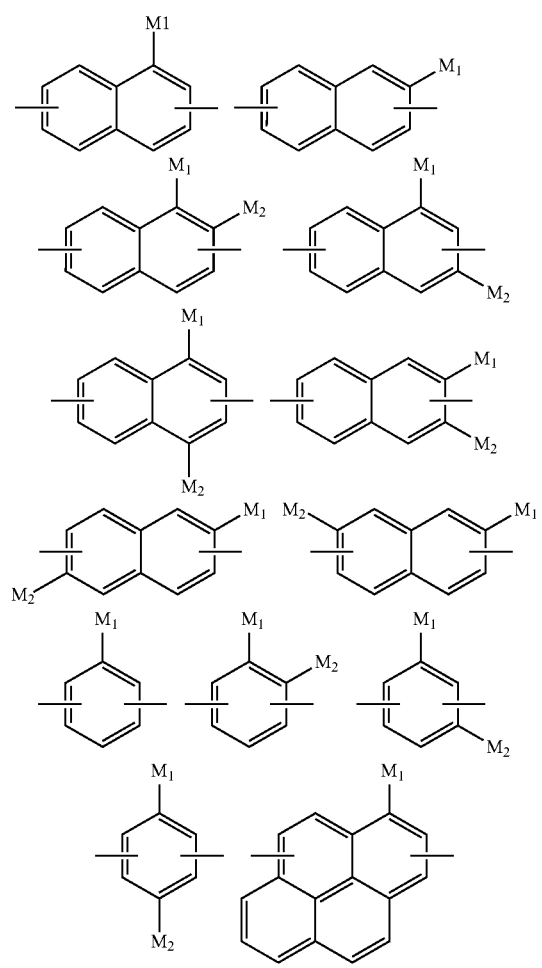
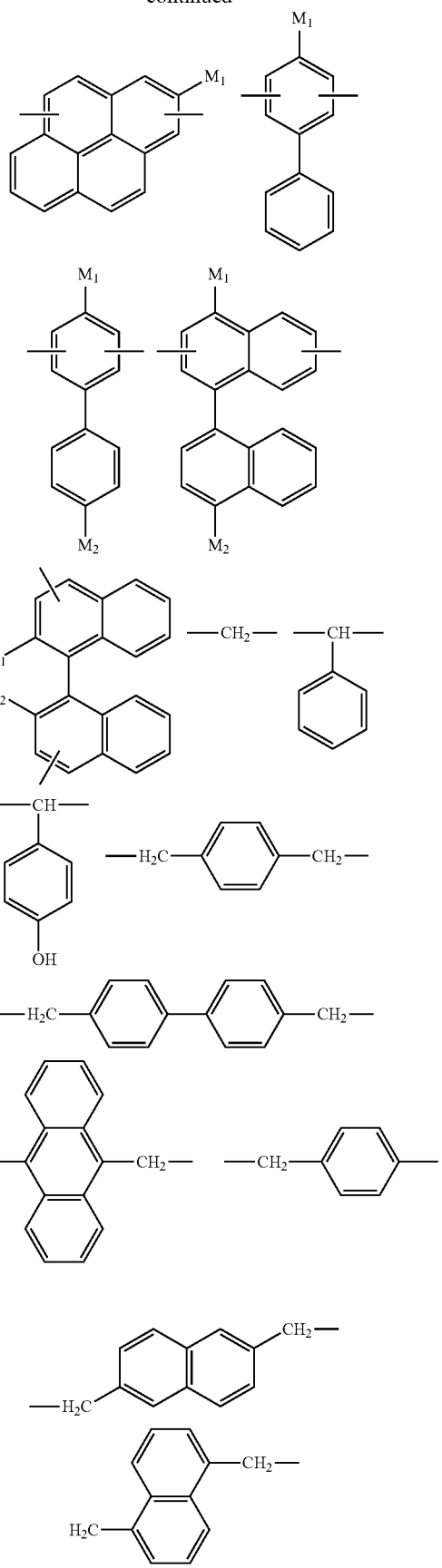

-continued

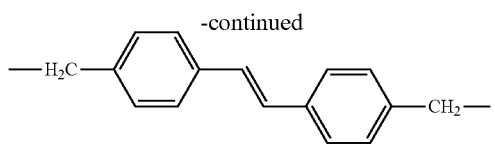

In the Group 2, $M^1$ and $M^2$ are independently hydrogen, a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

[Chemical Formula 3]

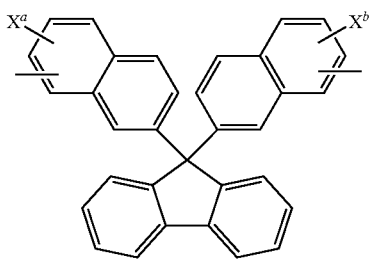

According to the present example embodiment, in Chemical Formula 3, $X^a$ and $X^b$ are independently a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

The monomer in the hardmask composition according to the present example embodiment will now be described.

In the present example embodiment, the monomer has a structure including a core. In Chemical Formula 1, a core represented by A may be a substituted or unsubstituted aromatic ring group, a substituted or unsubstituted aliphatic cyclic group, a substituted or unsubstituted C1 to C20 alkylene group, a substituted or unsubstituted C2 to C20 alkenylene group, a substituted or unsubstituted C2 to C20 alkynylene group, or a combination thereof. The monomer may have a structure including the core and two or more substituents According to the present example embodiment, the monomer includes a substituted or unsubstituted cyclic group in the substituent.

For example, the monomer may include a substituted or unsubstituted cyclic group selected from the following Group 3 as a core and a substituent.

[Group 3]

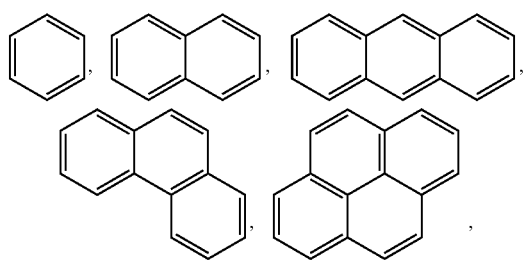

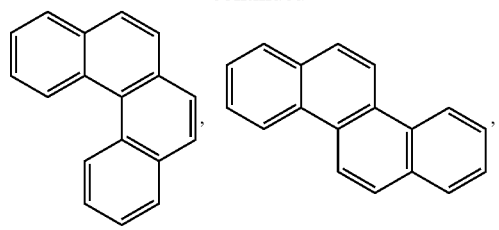

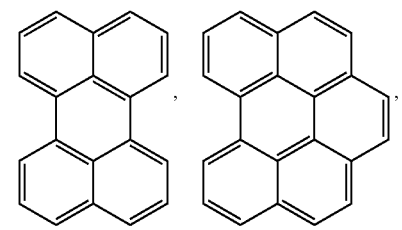

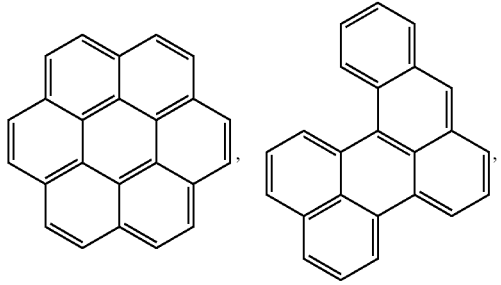

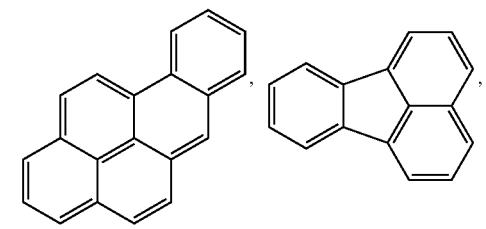

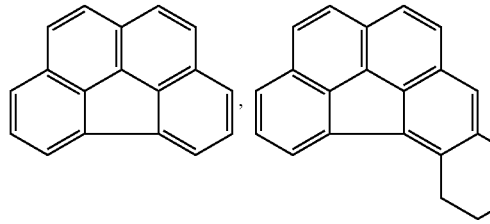

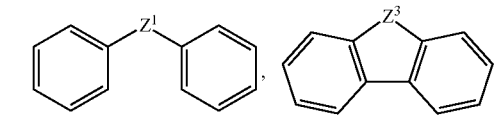

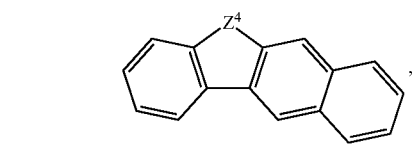

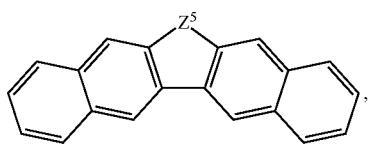

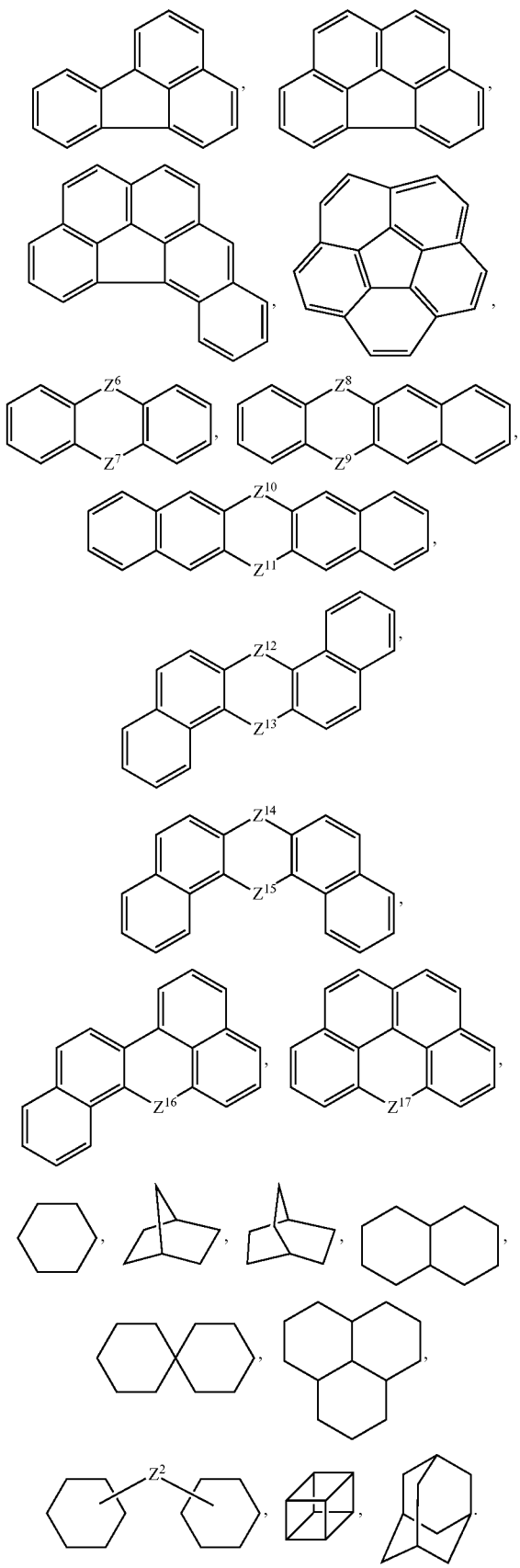

According to the present example embodiment, in the Group 3, $Z^1$ and $Z^2$ are independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, $NR^a$, oxygen (O), sulfur (S), or a combination thereof, wherein $R^a$ is hydrogen, a substituted or unsubstituted C1 to C10 alkyl group, a halogen atom, or a combination thereof, and $Z^3$ to $Z^{17}$ are independently C=O, $NR^a$, oxygen (O), sulfur (S), $CR^bR^c$, or a combination thereof, wherein $R^a$ to $R^c$ are independently hydrogen, a substituted or unsubstituted C1 to C10 alkyl group, a halogen atom, a halogen-containing group, or a combination thereof.

In the Group 3, binding positions of each ring are not particularly limited, and each ring may be substituted or unsubstituted. When the rings listed in the Group 3 are a substituted ring, it may be, for example substituted with a C1 to C20 alkyl group, a halogen atom, a hydroxy group, etc.

In Chemical Formula 1, at least one of the A, A' and A" may be, for example a polycyclic aromatic group in the Group 1.

According to the present example embodiment, m and n indicating the number of substituents in Chemical Formula 1 are independently an integer of greater than or equal to 0, a minimum value of the sum of m and n is 1, and the monomer has at least one substituent. When the m and n satisfy the condition, the m and n may be selected appropriately so that the sum of the m and n may not exceed a maximum number of a substituent of A. For example, the m and n may independently be an integer ranging from 1 to 6.

According to the present example embodiment, the monomer includes a predetermined functional group (X and X') in a substituent respectively. The monomer includes the functional groups and thus may provide improved solubility and may be effective for a spin-on coating method. In addition, the monomer may have excellent gap-fill characteristics to fill a gap among patterns and excellent planarization characteristics when spin-on coated on a lower layer having a predetermined pattern.

In addition, cross-linking may be amplified based on a condensation reaction of the functional groups, and excellent cross-linking characteristics may be provided. Accordingly, the monomer may be cross-linked into a polymer having a high molecular weight in a short time when heat-treated at a relatively low temperature, and may show excellent characteristics useful for a hardmask layer, such as mechanical characteristics, heat resistance properties, and etch resistance.

For example, in Chemical Formula 1, at least one hydrogen of A, A' or A" may be substituted with a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

The monomer may be represented by, for example one of the following Chemical Formulae 1a to 1h.

[Chemical Formula 1a]

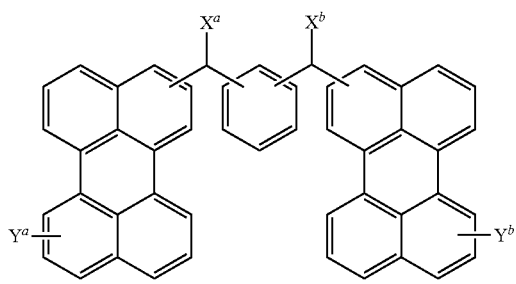

[Chemical Formula 1b]

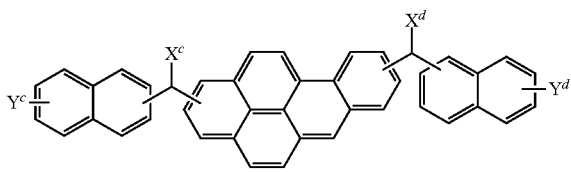

[Chemical Formula 1c]

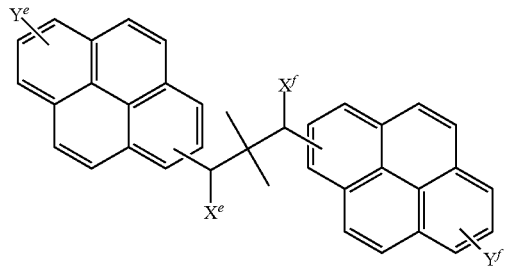

[Chemical Formula 1d]

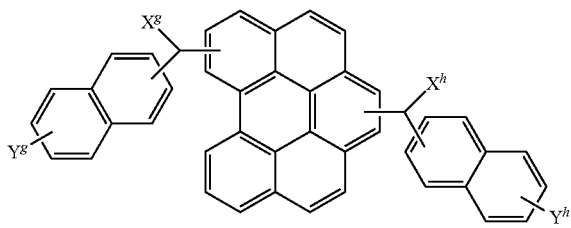

[Chemical Formula 1e]

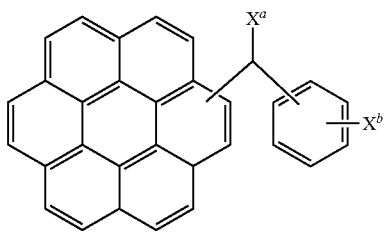

[Chemical Formula 1f]

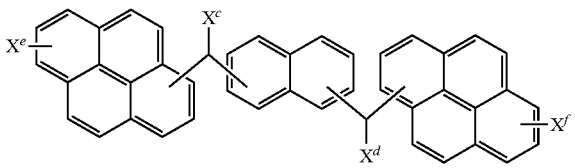

[Chemical Formula 1g]

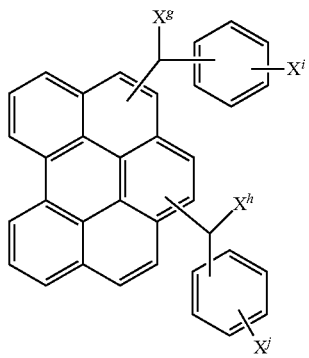

[Chemical Formula 1h]

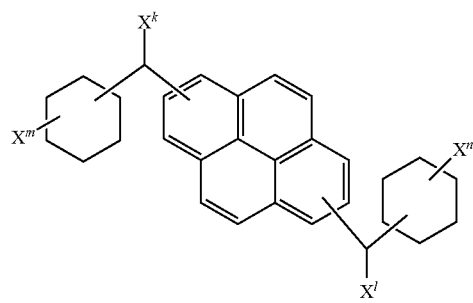

In Chemical Formulae 1a to 1h, $X^a$ to $X^n$ and $Y^a$ to $Y^h$ are independently a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

The monomer may have a core that is an alkylene group as shown in Chemical Formula 1c.

The monomer may have a molecular weight of about 200 to about 5,000. When the monomer has a molecular weight within the above range, solubility of the monomer having high carbon content in a solvent may be improved and an improved thin layer may be obtained through spin-on coating.

One kind of the monomer described above may be used, or two or more kinds of the monomers may be mixed.

Next, the polymer included in the hardmask composition is described.

According to the present example embodiment, the hardmask composition includes the polymer including the moiety represented by Chemical Formula 2, the polymer including the moiety represented by Chemical Formula 3, or a combination thereof.

The polymer including the moiety represented by Chemical Formula 2 will now be described.

According to the present example embodiment, the polymer includes a substituted or unsubstituted aromatic group represented by Ar in the repeating unit. The Ar may be selected from the Group 1, and may be, for example, a polycyclic aromatic group.

At least one hydrogen of the Ar may be, for example, substituted with a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

In Chemical Formula 2, B may be one or a combination of two or more selected from the Group 2. The combination may be selected depending on desired properties, for example, by selecting two or three from the Group 2, etc. In addition, positions of the combined subjects may be varied.

The moiety represented by Chemical Formula 2 may include, for example moieties represented by the following Chemical Formulae 2a to 2c, etc.

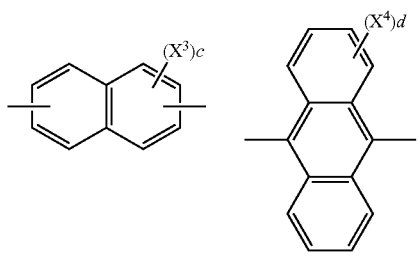

[Chemical Formula 2a]

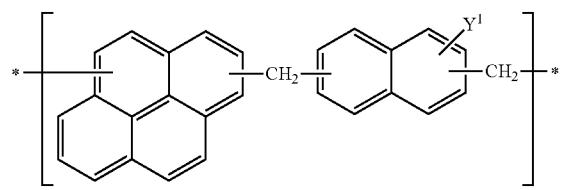

[Chemical Formula 2b]

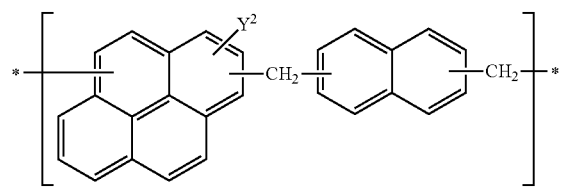

[Chemical Formula 2c]

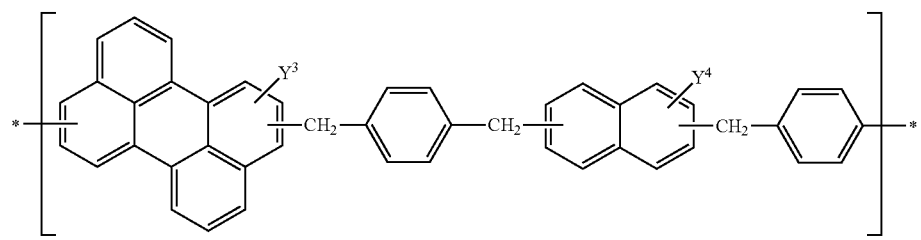

According to the present example embodiment, in Chemical Formulae 2a to 2d, $Y^1$ to $Y^4$ are independently a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

Next, the polymer including the moiety represented by Chemical Formula 3 is described.

According to the present example embodiment, the polymer includes a moiety represented by Chemical Formula 3. The polymer has a structure including a fluorene backbone in the repeating unit, which may improve heat resistance of the hardmask composition.

The polymer including the moiety represented by Chemical Formula 3 may further include a moiety including one or a combination of two or more selected from groups listed in Group 4.

[Group 4]

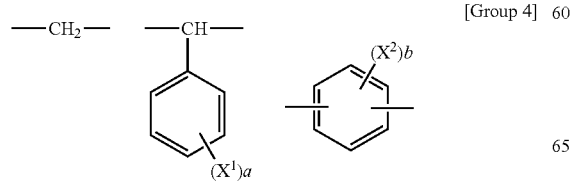

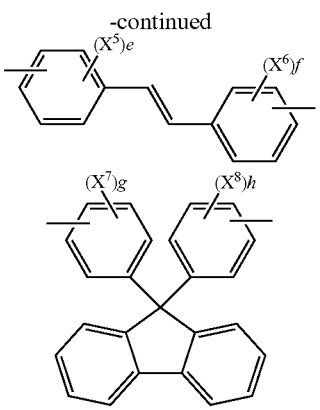

According to the present example embodiment, in the Group 4, $X^1$ to $X^8$ are independently a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof, and a to h are independently integers of 0 to 4.

For example, three groups of the groups listed in the Group 4 may be selected and combined. The selected groups may be the same or different.

The moiety represented by Chemical Formula 3 may include, for example moieties represented by the following Chemical Formulae 3a or 3b.

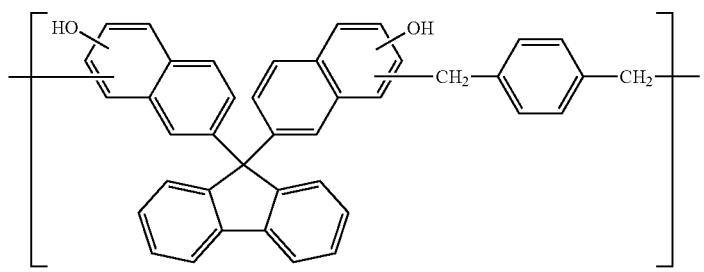

[Chemical Formula 3a]

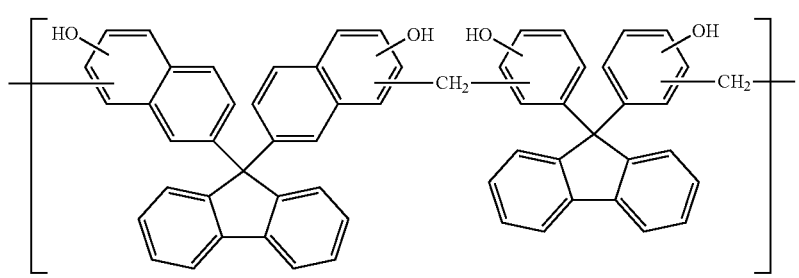

[Chemical Formula 3b]

The polymer including the moiety represented by Chemical Formula 2 and the polymer including the moiety represented by Chemical Formula 3 may each have, for example, a weight average molecular weight of about 500 to about 10,000, e.g., about 1,000 to about 10,000, etc.

One kind of the polymer including the moiety represented by Chemical Formula 2 may be included in the hardmask composition, or two or more kinds of the polymers may be mixed. Likewise, one kind of the polymer including the moiety represented by Chemical Formula 3 may be included in the hardmask composition, or two or more kinds of the polymers may be mixed.

The solvent may be a suitable solvent having sufficient solubility or dispersion for the monomer and the polymer, and may be, for example, at least one selected from propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyl lactate, gamma-butyrolactone, methylpyrrolidone, and acetylacetone.

The monomer and the polymer may be included in an amount of about 0.1 parts by weight to about 50 parts by weight based on 100 parts by weight of the solvent. Herein, the polymer refers to the polymer including the moiety represented by Chemical Formula 2, the polymer including the moiety represented by Chemical Formula 3, or a combination thereof.

When the monomer and the polymer are included within the above range, a desired thickness of a coated thin film may be obtained.

For example, the monomer and the polymer may be included in a weight ratio of about 9:1 to about 1:9. Herein, the polymer refers to the polymer including the moiety represented by Chemical Formula 2, the polymer including the moiety represented by Chemical Formula 3, or a combination thereof.

When the hardmask composition includes the polymer including the moiety represented by Chemical Formula 2, a weight ratio of the monomer and the polymer including the moiety represented by Chemical Formula 2 may be, for example about 5:5 to about 1:9, and when the hardmask composition includes the polymer including the moiety represented by Chemical Formula 3, a weight ratio of the monomer and the polymer including the moiety represented by Chemical Formula 3 may be, for example about 3:7 to about 9:1, etc.

The hardmask composition may further include a surfactant.

The surfactant may include, for example, an alkylbenzene sulfonate salt, an alkyl pyridinium salt, a polyethylene glycol, or a quaternary ammonium salt, etc.

The surfactant may be included in an amount of about 0.001 to about 3 parts by weight based on 100 parts by weight of the hardmask composition. Within the amount range, the solubility may be secured while reducing or avoiding changes in the optical properties of the hardmask composition.

Hereafter, a method for forming patterns by using a hardmask composition according to an embodiment is described.

A method of forming patterns according to an example embodiment includes providing a material layer on a substrate, applying the hardmask composition including the monomer, polymer and solvent on the material layer, heat-treating the hardmask composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The substrate may be, for example, a silicon wafer, a glass substrate, or a polymer substrate.

The material layer is a material to be finally patterned, for example a metal layer such as an aluminum layer or a copper layer, a semiconductor layer such as a silicon layer, or an insulation layer such as a silicon oxide layer or a silicon nitride layer. The material layer may be formed through a method such as a chemical vapor deposition (CVD) process.

The hardmask composition may be applied by spin-on coating in a form of a solution.

Herein, a thickness of the hardmask composition is not particularly limited, but may be, for example about 100 Å to about 10,000 Å.

The heat-treating the hardmask composition may be performed, for example about 100 to about 500° C. for about 10 seconds to 10 minutes. During heat-treating, the monomer may cause a self cross-linking and/or mutual cross-linking reaction.

The silicon-containing thin layer may be made of, for example silicon nitride, silicon oxide, or silicon oxynitride (SiON).

The method may further include forming a bottom anti-reflective coating (BARC) on the silicon-containing thin layer. For example, a silicon oxynitride-containing thin layer may be formed on the hardmask layer, then a bottom antireflective coating is formed, and subsequently a photoresist layer is formed on the bottom antireflective coating.

Exposure of the photoresist layer may be performed using, for example ArF, KrF, or EUV. After exposure, heat treatment may be performed at about 100° C. to about 500° C.

The etching process of the exposed part of the material layer may be performed through a dry etching process using an etching gas and the etching gas may be, for example $CHF_3$, $CF_4$, $Cl_2$, $BCl_3$, a mixed gas thereof, etc.

The etched material layer may be formed in a plurality of patterns, and the plurality of patterns may be a metal pattern, a semiconductor pattern, an insulation pattern, and the like, for example diverse patterns of a semiconductor integrated circuit device.

The patterns included in a semiconductor integrated circuit device may be, for example, a metal line; a semiconductor pattern; an insulation layer including a contact hole, a bias hole, a damascene trench, etc.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Monomer

Synthesis Example 1

First Step

Friedel-Crafts Acylation Reaction

A solution was prepared by putting 29.6 g (0.105 mol) of methoxy perylene, 11.06 g (0.05 mol) of isophthaloyl chloride, and 223 g of dichloroethane in a flask. Subsequently, 14.68 g (0.105 mol) of aluminum chloride was added little by little to the solution, and the mixture was agitated for 2 hours. When the reaction was complete, the obtained reactant as powder was filtered and dried.

Second Step

Demethylation Reaction

The obtained compound, 39.62 g (0.2 mol) of 1-dodecanethiol, 13.73 g (0.24 mol) of potassium hydroxide, and 350 g of N,N-dimethylformamide were put in a flask and agitated at 120° C. for 3 hours. Subsequently, the mixture was cooled down, neutralized to pH 7 with a 5% hydrogen chloride solution, and extracted with ethyl acetate, and the extract was dried.

Third Step

Reduction Reaction 100 mL of the obtained compound was dissolved in tetrahydrofuran in a flask, 25.56 g (0.67 mol) of sodium borohydride was added little by little thereto, and the mixture was agitated at 50° C. for 12 hours. When the reaction was complete, the reactant was neutralized to pH 7 with a 7% hydrogen chloride solution and extracted with ethyl acetate, obtaining a compound represented by the following Chemical Formula 1 aa.

[Chemical Formula 1aa]

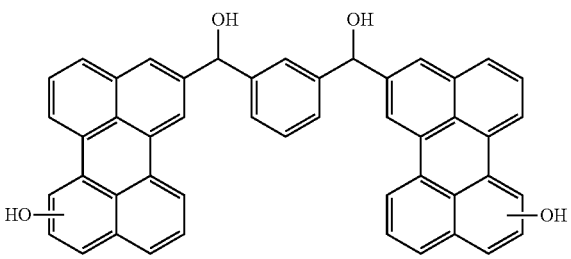

Synthesis Example 2

First Step

Friedel-Crafts Acylation Reaction 15.85 g (0.05 mol) of benzopyrene, 23.13 g (0.105 mol) of methoxy naphthoyl chloride, and 214 g of dichloroethane were put in a flask to prepare a solution. 14.68 g (0.11 mol) of aluminum chloride was slowly added to the solution, and the mixture was agitated at room temperature for 1 hour. When the reaction was complete, methanol was added thereto, and a precipitate produced therein was filtered and dried.

Second Step

Demethylation Reaction

The compound, 36.21 g (0.18 mol) of 1-dodecanethiol, 12.55 g (0.22 mol) of potassium hydroxide, and 315 g of N,N-dimethylformamide were put in a flask, and the mixture was agitated at 120° C. for 8 hours. Subsequently, the mixture was cooled down, neutralized to pH 7 with a 5% hydrogen chloride solution, and extracted with ethyl acetate, and the extract was dried.

Third Step

Reduction Reaction

The compound was dissolved in 100 mL of tetrahydrofuran in a flask, 22.98 g (0.60 mol) of lithium aluminum hydride was added little by little thereto for a reaction. When the reaction was complete, a by-product from the reaction was removed by using a mixture of water/methanol, obtaining a compound represented by the following Chemical Formula 1bb.

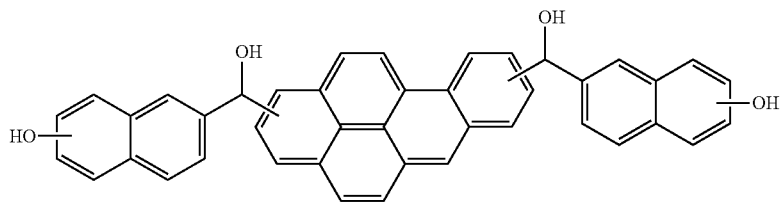

[Chemical Formula 1bb]

Synthesis Example 3

First Step

Friedel-Crafts Acylation Reaction 22.6 g (0.1345 mol) of dimethylmalonyl chloride, 62.4 g (0.269 mol) of methoxypyrene, and 556 g of 1,2-dichloroethane were put in a flask to prepare a solution. Subsequently, 17.9 g (0.1345 mol) of aluminum chloride was slowly added to the solution, and the mixture was agitated at room temperature for 12 hours. When the reaction was complete, a precipitate produced by adding methanol thereto was filtered and dried.

Second Step

Demethylation Reaction 5.60 g (0.01001 mol) of the obtained compound, 10.13 g (0.05005 mol) of 1-dodecanethiol, 3.37 g (0.06006 mol) of potassium hydroxide, and 27.6 g of N,N-dimethylformamide were put in a flask and agitated at 120° C. for 8 hours. The mixture was cooled down and neutralized to about pH 6-7 with a 5% hydrogen chloride solution, and a precipitate produced therein was filtered and dried.

Third Step

Reduction Reaction 2.19 g (0.004120 mol) of the obtained compound and 28.5 g of tetrahydrofuran were put in a flask to prepare a solution. Subsequently, 3.12 g (0.08240 mol) of a sodium borohydride aqueous solution was slowly added to the solution, and the mixture was agitated for 24 hours at room temperature. When the reaction was complete, the reactant was neutralized to about pH 7 with a 5% hydrogen chloride solution and extracted with ethyl acetate, and the extract was dried, obtaining a compound represented by the following Chemical Formula 1 cc.

[Chemical Formula 1cc]

Synthesis Example 4

First Step

Friedel-Crafts Acylation Reaction 27.6 g (0.1 mol) of benzoperylene and 48.5 g (0.22 mol) of methoxy naphthoyl chloride along with 500 g of a chloroform/dichloromethane mixed solution were put in a flask and agitated by using a stirring bar. Subsequently, 61.2 g (0.35 mol) of aluminum chloride was added little by little to the mixture, and the resulting mixture was reacted. When the reaction was complete, a precipitate produced by adding methanol to the mixture was filtered and dried.

Second Step

Demethylation Reaction 6.50 g (0.01001 mol) of the obtained compound, 10.13 g (0.05005 mol) of 1-dodecanethiol, 3.37 g (0.06006 mol) of potassium hydroxide, and 27.6 g of N,N-dimethylformamide were put in a flask and agitated at 120° C. for 8 hours. Subsequently, the reactant was cooled down and neutralized to about pH 6-7 with a 5% hydrogen chloride solution, and a precipitate produced therein was filtered and dried.

Third Step

Reduction Reaction 5.60 g (0.01001 mol) of the obtained compound, 40 ml of formamide, and 5 ml of 85% formic acid were put in a flask and heated and refluxed at 190° C. for 3 hours. Subsequently, the reactant was cooled down to a temperature of less than or equal to 100° C. and added to 250 ml of water at room temperature, and a precipitate produced therein was filtered and washed with a mixture of water/methanol to remove a by-product therefrom, obtaining a compound represented by the following Chemical Formula 1dd.

[Chemical Formula 1dd]

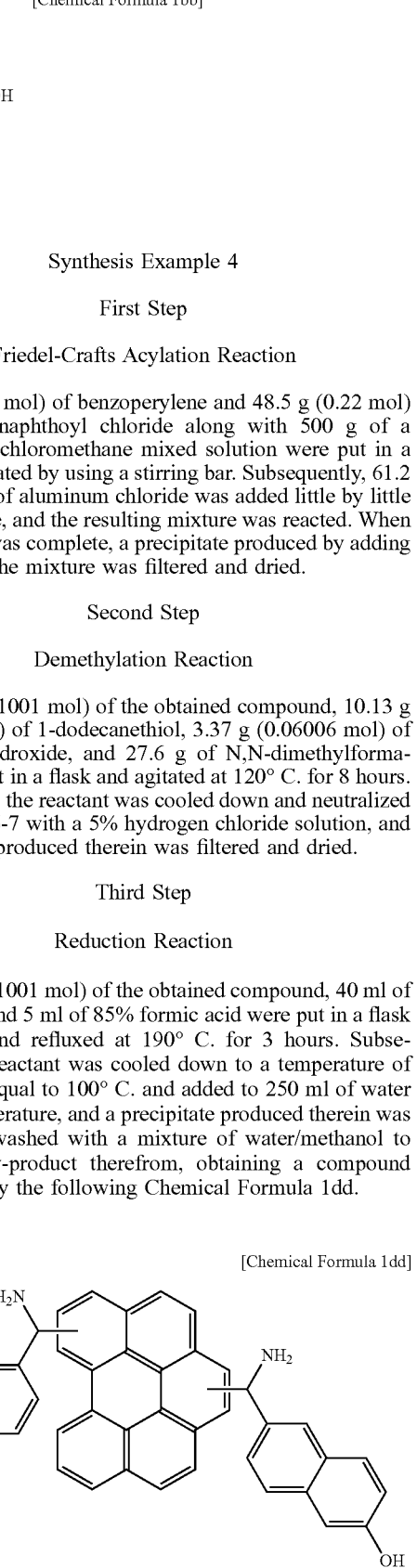

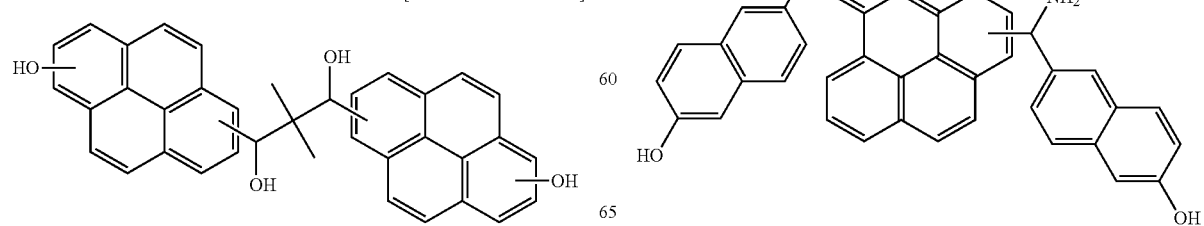

Synthesis Example 5

50.0 g (0.166 mol) of coronene, 56.8 g (0.333 mol) of 4-methoxybenzoylchloride, and 353 g of 1,2-dichloroethane were put in a flask to prepare a solution. Subsequently, 44.4 g (0.333 mol) of aluminum chloride was slowly added to the solution at room temperature, and the mixture was heated up to 60° C. for 8 hours for a reaction. When the reaction was complete, a precipitate produced by adding methanol to the solution was filtered, obtaining 4-methoxybenzoyl coronene.

50.0 g (0.880 mol) of the obtained 4-methoxybenzoyl coronene, 89.0 g (0.440 mol) of 1-dodecanethiol, 29.6 g (0.528 mol) of potassium hydroxide, and 253 g of N,N-dimethylformamide were put in a flask and agitated at 120° C. for 8 hours. Subsequently, the mixture was cooled down, neutralized to about pH 7 with a 10% hydrogen chloride solution, and extracted with ethyl acetate, obtaining 4-hydroxybenzoyl coronene.

25.0 g (0.0463 mol) of the obtained coronene having a 4-hydroxybenzoyl group and 170 g of tetrahydrofuran were put in a flask, preparing a solution. 17.5 g (0.463 mol) of a sodium borohydride aqueous solution was slowly added to the solution, and the mixture was agitated at room temperature for 24 hours. When the reaction was complete, the reactant was neutralized to about pH 7 with a 10% hydrogen chloride solution and extracted with ethyl acetate, obtaining a monomer represented by the following Chemical Formula 1 ee.

[Chemical Formula 1ee]

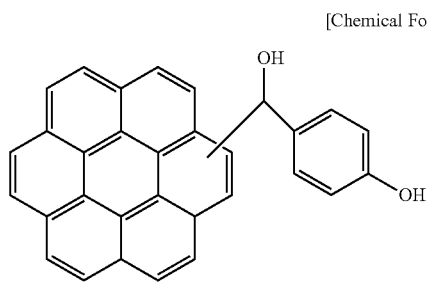

Synthesis Example 6

34 g (0.1345 mol) of naphthalene-2.6-dicarbonyldichloride, 62.4 g (0.269 mol) of methoxypyrene, and 496 g of a 1,2-dichloroethane/chloroform mixed solution were put in a flask to prepare a solution. 35.8 g (0.269 mol) of aluminum chloride was slowly added to the solution, and the mixture was agitated for a reaction at room temperature for 12 hours. When the reaction was complete, a precipitate produced by adding methanol thereto was filtered and dried.

64.4 g (0.1 mol) of the obtained compound, 101.3 g (0.5 mol) of 1-dodecanethiol, 33.7 g (0.60 mol) of potassium hydroxide, and 300.3 g of N,N-dimethylformamide were put in a flask and agitated at 120° C. for 8 hours. Subsequently, the mixture was cooled down and neutralized to about pH 6-7 with a 5% hydrochloric acid solution, and a precipitate produced therein was filtered and dried.

43 g (0.07 mol) of the obtained compound and 285 g of tetrahydrofuran were put in a flask, subsequently 52.9 g (1.4 mol) of a sodium borohydride aqueous solution was slowly added thereto, and the mixture was agitated for a reaction at room temperature for 24 hours. When the reaction was complete, the reactant was neutralized to about pH 7 with a 5% hydrochloric acid solution and extracted with ethyl acetate, and the extract was dried, obtaining a monomer represented by the following Chemical Formula 1ff.

[Chemical Formula 1ff]

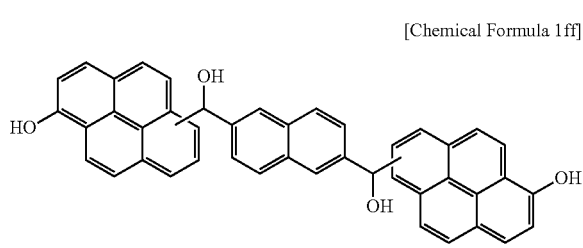

Synthesis Example 7

46 g (0.166 mol) of benzoperylene, 55 g (0.333 mol) of 4-iodobenzoylchloride, and 700 g of a chloroform/dichloromethane mixed solution were put in a flask to prepare a solution. While the solution was agitated, 49 g (0.366 mol) of aluminum chloride was added little by little thereto, and the mixture was reacted at 40° C. for 12 hours. When the reaction was complete, a precipitate produced therein was filtered and washed with methanol. 74 g (0.1 mol) of the dried product, $K_4Fe(CN)_6$ (0.06 mol), a PS-Pd(II)-anthrax catalyst (Palladium(II) bound to anthranilic acid anchored to chloromethylated polystyrene) (1.0 mol % of Pd), and triethylamine (0.2 mol) were dissolved in 300 mL of N,N-dimethylformamide, and the solution was reacted at 100° C. for 24 hours. When the reaction was complete, the reaction mixture was cooled down to room temperature and filtered to remove the catalyst, and the filtered solution was purified through silica gel.

The obtained powder was dissolved in 300 mL of tetrahydrofuran, and 38 g (1.0 mol) of lithium aluminum hydride ($LiAlH_4$) was added little by little thereto for a reaction. When the reaction was complete, a mixture of water/ethyl acetate was used to remove a by-product, obtaining a monomer represented by the following Chemical Formula 1gg.

[Chemical Formula 1gg]

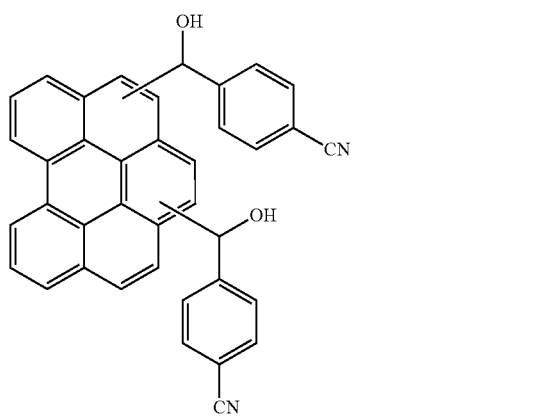

Synthesis Example 8

9.5 g (0.054 mol) of 4-methoxycyclohexane-1-carbonylchloride, 6.24 g (0.027 mol) of pyrene, and 53 g of 1,2- dichloroethane were put in a flask to prepare a solution. 3.6 g (0.027 mol) of aluminum chloride was slowly added to the solution, and the mixture was agitated for a reaction at room temperature for 12 hours. When the reaction was complete, a precipitate produced by adding methanol thereto was filtered and dried.

9.65 g (0.02 mol) of the obtained compound and 6 g (0.04 mol) of sodium iodide were put in a flask and dissolved in 50 mL of acetonitrile. Then, 10.84 g (0.04 mol) of trifluorinated boron etherate was injected thereinto with a predetermined pressure, and the mixture was agitated at room temperature for 8 hours. The obtained mixture was agitated with 50 mL of a sodium bicarbonate aqueous solution, and the mixture was extracted with 30 mL of ether. In the obtained mixture, an organic layer therein was washed with 40 mL of a sodium thiosulfate aqueous solution and then with 100 mL of water and dried.

17.4 g of tetrahydrofuran was added to 4.5 g (0.01 mol) of the obtained compound, 7.1 g (0.2 mol) of a sodium borohydride aqueous solution was slowly added thereto, and the mixture was agitated for a reaction at room temperature for 24 hours. When the reaction was complete, the reactant was neutralized to about pH 7 with a 5% hydrochloric acid solution, extracted with ethyl acetate, and dried, obtaining a monomer represented by Chemical Formula 1hh.

[Chemical Formula 1hh]

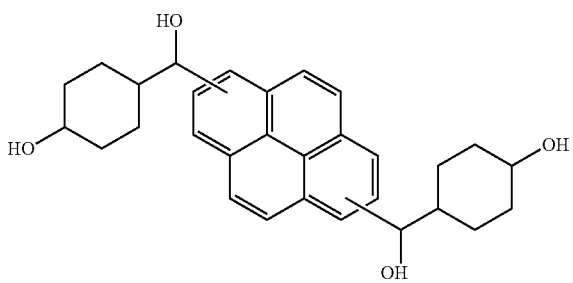

Synthesis of Polymer

Polymerization Example 1

28.33 g (0.2 mol) of 1-naphthol, 28.32 g (0.14 mol) of pyrene, and 12.0 g (0.34 mol) of paraformaldehyde were put in a flask. Subsequently, 0.19 g (0.34 mol) of p-toluene sulfonic acid monohydrate was dissolved in 162 g of propylene glycol monomethyletheracetate (PGMEA), the solution was injected into the flask, and the mixture was agitated at 90 to 100° C. for 5 to 12 hours. The reaction was finished when a specimen taken from the polymerization reactant every one hour had a weight average molecular weight ranging from 3500 to 4000. Then, the reaction was cooled down to room temperature. The reactant was put into 40 g of distilled water and 400 g of methanol, and the mixture was strongly agitated and allowed to stand (primary). A precipitate left after removing a supernatant therefrom was dissolved in 80 g of polypropylene glycol monomethyletheracetate (PGMEA) (secondary). The primary and secondary processes were regarded as one purification process, and the purification process was repeated three times. The purified polymer was dissolved in 80 g of propylene glycol monomethyletheracetate (PGMEA), and methanol and distilled water remaining in the solution were removed under a reduced pressure, obtaining a compound represented by the following Chemical Formula 2aa.

[Chemical Formula 2aa]

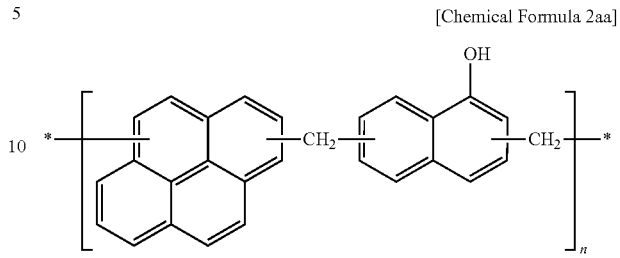

Polymerization Example 2

25.63 g (0.2 mol) of naphthalene, 30.56 g (0.14 mol) of hydroxypyrene, and 12.0 g (0.34 mol) of paraformaldehyde were put in a flask. Subsequently, 0.19 g (0.34 mol) of p-toluene sulfonic acidmonohydrate was dissolved in 162 g of propylene glycol monomethyletheracetate (PGMEA), and the solution was put in a flask and agitated at 90 to 100° C. for 5 to 12 hours. The reaction was finished when a specimen taken from the polymerization reactant every one hour had a weight average molecular weight ranging from 4,200 to 5,000.

The same purification process as the Polymerization Example 1 was performed, obtaining a compound represented by the following Chemical Formula 2bb.

[Chemical Formula 2bb]

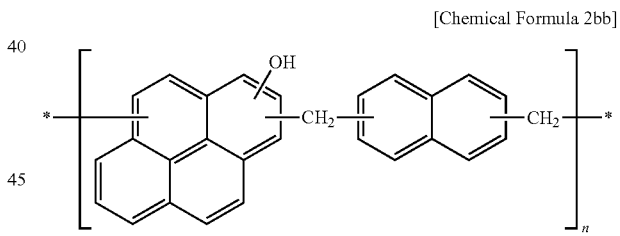

Polymerization Example 3

16.52 g (0.055 mol) of 1-hydroxy perylene and 9.9 g (0.068 mol) of 1-naphthol were sequentially put in a flask and dissolved in 32 g of propylene glycol monomethyletheracetate (PGMEA) to prepare a solution. Subsequently, 22 g (0.11 mol) of 1,4-bismethoxymethylbenzene and 0.8 g (0.009 mol) of diethyl sulfite were added to the solution, and the mixture was agitated at 90 to 120° C. for 8 to 15 hours. The reaction was finished when a specimen taken from the polymerization reactant every one hour had a weight average molecular weight ranging from 4,600 to 5,500.

Then, the same purification process as Polymerization Example 1 was repeated seven times, obtaining a compound represented by the following Chemical Formula 2 cc.

[Chemical Formula 2cc]

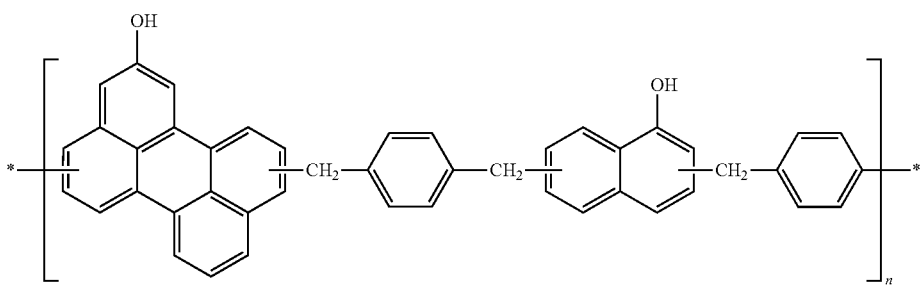

Polymerization Example 4

8.75 g (0.05 mol) of α,α'-dichloro-p-xylene, 26.6 g (0.11 mol) of aluminum chloride, and γ-butyrolactone were put in a flask to prepare a solution. The solution was sufficiently agitated, about 10 minutes later, 45.05 g (0.10 mol) of 6,6'-(9-fluorenylidene)dinaphthalen-2-ol was slowly added to 200 g of the solution, and the mixture was heated up to 110° C. and agitated for a reaction for about 8 hours. When the reaction was complete, the reactant was concentrated with an evaporator after removing acid by using water. Subsequently, the concentrated product was diluted by using methylamyl ketone (MAK) and methanol and adjusted by using a MAK/methanol solution (a weight ratio of 4/1) having a concentration of 15 wt %. The obtained mixture was put in a separatory funnel, and, subsequently n-heptane was added thereto to remove low molecular components including a monomer, obtaining a polymer represented by the following Chemical Formula 3aa.

[Chemical Formula 3aa]

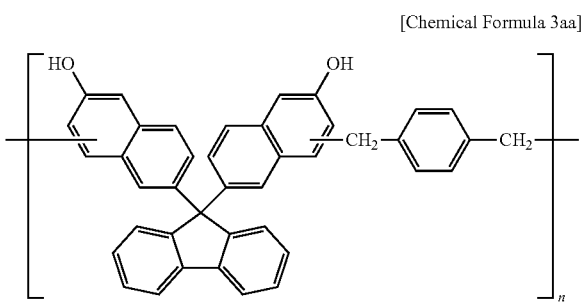

(n=9)

The polymer had a weight average molecular weight of 5,000 and polydispersity of 2.3.

Polymerization Example 5

45.05 g (0.10 mol) of 6,6'-(9-fluorenylidene)dinaphthalen-2-ol, 35.03 g (0.10 mol) of 4,4'-(9-fluorenylidene)diphenol, and 10.6 g (0.3 mol) of paraformaldehyde were put in a flask. On the other hand, 0.19 g (1 mmol) of p-toluene sulfonic acidmonohydrate was dissolved in 162 g of propylene glycol monomethyletheracetate (PGMEA) to prepare a solution, the solution was added to the flask, and the mixture was agitated for a reaction at 80° C. for 6 hours.

When the reaction was complete, the reactant was slowly cooled down to room temperature and injected into a mixed solution of 40 g of distilled water and 400 g of methanol, and the mixture was strongly agitated and allowed to stand. A precipitate obtained after removing a supernatant was dissolved in 80 g of propylene glycol monomethyletheracetate (PGMEA), and the solution was strongly agitated by using 320 g of methanol and allowed to stand (primary). The precipitate obtained by removing the obtained supernatant again was dissolved in 80 g of propylene glycol monomethyletheracetate (PGMEA) (secondary). The primary and secondary processes were regarded as one purification process, and the purification process was repeated three times in total. The purified polymer was dissolved in 80 g of propylene glycol monomethyletheracetate (PGMEA), and methanol and distilled water remaining in the solution were removed therefrom under a reduced pressure, obtaining a polymer represented by the following Chemical Formula 3bb.

[Chemical Formula 3bb]

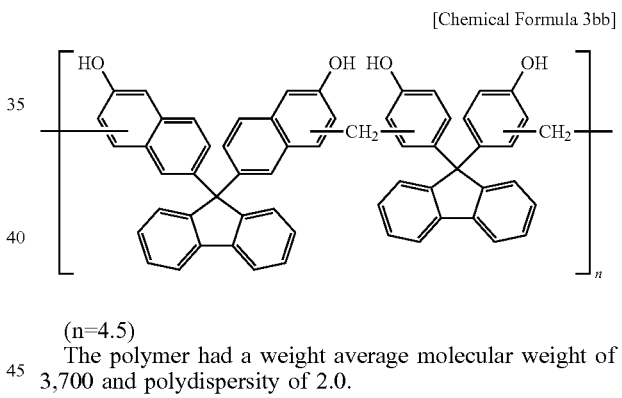

(n=4.5)

The polymer had a weight average molecular weight of 3,700 and polydispersity of 2.0.

Comparative Synthesis Example 1

First Step

Friedel-Crafts Acylation Reaction 50.0 g (0.166 mol) of coronene, 46.8 g (0.333 mol) of benzoylchloride and 330 g of 1,2-dichloroethane were put in a flask to prepare a solution. Subsequently, 44.4 g (0.333 mol) of aluminum chloride was slowly added to the solution at room temperature, and the mixture was heated up to 60° C. and agitated for 8 hours. When the reaction was complete, a precipitate by adding methanol to the solution was filtered and dried.

Second Step

Reduction Reaction 25.0 g (0.0492 mol) of the compound and 174 g of tetrahydrofuran were put in a flask. Subsequently, 18.6 g (0.492 mol) of a sodium borohydride aqueous solution was slowly added to the solution, and the mixture was agitated at room temperature for 24 hours. When the reaction was complete, the reactant was neutralized to about pH 7 with a 5% hydrogen chloride solution, extracted with ethyl acetate, and dried, obtaining a compound represented by the following Chemical Formula 4.

[Chemical Formula 4]

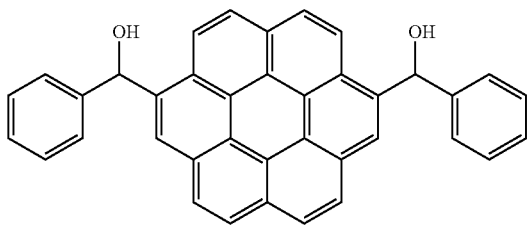

Comparative Polymerization Example 1

10 g (0.057 mol) of benzylmethacrylate and 10.6 g (0.057 mol) of cyclohexylmethacrylate were mixed in 41 g of methylethyl ketone under a nitrogen atmosphere in a flask. Then, 2.6 g of dimethyl-2,2'-azobis(2-methylpropionate) as a polymerization initiator was added to the mixture at 80° C. for 4 hours with a syringe, and the mixture was additionally agitated for 2 hours. When the polymerization was complete, the obtained polymer was slowly precipitated in a hexane solvent. The produced precipitate was filtered and dissolved in a hexane/isopropanol mixed solvent in an appropriate amount again, and the solution was agitated. Subsequently, the obtained precipitate was dried in a vacuum oven maintained at 50° C. for about 24 hours, obtaining a compound represented by Chemical Formula 5.

The polymer had a weight average molecular weight (Mw) of 6200 and polydispersity (Mw/Mn) of 1.45.

[Chemical Formula 5]

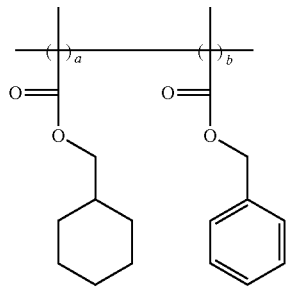

(In Chemical Formula 5, a:b=1:1)

Preparation of Hardmask Composition

Example 1

The monomer according to Synthesis Example 1 and the polymer according to Polymerization Example 1 in a weight ratio of 3:7 were dissolved in a mixed solvent of propylene glycol monomethyl ether acetate (PGMEA) and cyclohexanone (7:3 v/v) to prepare a solution. Subsequently, the solution was filtered to prepare a hardmask composition. The content of the compounds was adjusted depending on a desired thickness.

Example 2

A hardmask composition was prepared according to the same method as Example 1 except for using the monomer according to Synthesis Example 2 and the polymer according to Polymerization Example 2 in a weight ratio of 5:5.

Example 3

A hardmask composition was prepared according to the same method as Example 1 except for using the monomer according to Synthesis Example 3 and the polymer according to Polymerization Example 3 in a weight ratio of 7:3.

Example 4

A hardmask composition was prepared according to the same method as Example 1 except for using the monomer according to Synthesis Example 4 and the polymer according to Polymerization Example 4 in a weight ratio of 3:7.

Example 5

The monomer according to Synthesis Example 5 and the polymer according to Polymerization Example 4 in a weight ratio of 5:5 were dissolved in a mixed solvent of propylene glycol monomethyl ether acetate (PGMEA) and cyclohexanone (7:3 v/v) to prepare a solution. Subsequently, the solution was filtered to prepare a hardmask composition. The content of the compounds was adjusted depending on a desired thickness.

Example 6

A hardmask composition was prepared according to the same method as Example 5 except for using the monomer according to Synthesis Example 6 and the polymer according to Polymerization Example 4 in a weight ratio of 5:5.

Example 7

A hardmask composition was prepared according to the same method as Example 5 except for using the monomer according to Synthesis Example 7 and the polymer according to Polymerization Example 5 in a weight ratio of 7:3.

Example 8

A hardmask composition was prepared according to the same method as Example 5 except for using the monomer according to Synthesis Example 8 and the polymer according to Polymerization Example 5 in a weight ratio of 7:3.

Comparative Example 1

The monomer according to Comparative Synthesis Example 1 was dissolved in a mixed solvent of propylene glycol monomethyl ether acetate (PGMEA) and cyclohexanone (7:3 (v/v)) to prepare a solution. Subsequently, the solution was filtered to prepare a hardmask composition. The content of the compound was adjusted depending on a desired thickness.

Comparative Example 2

The hardmask composition was prepared according to the same method as Comparative Example 1 except for using the polymer according to Comparative Polymerization Example 1 instead of the monomer according to Comparative Synthesis Example 1.

Comparative Example 3

The polymer according to Polymerization Example 4 was dissolved in a mixed solvent of propylene glycol monomethyl ether acetate (PGMEA) and cyclohexanone (7:3 (v/v)) to prepare a solution. Subsequently, the solution was filtered to prepare a hardmask composition. The content of the compound was adjusted depending on a desired thickness.

Comparative Example 4

The hardmask composition was prepared according to the same method as Comparative Example 3 except for using the polymer according to Polymerization Example 5 instead of the polymer according to Polymerization Example 4.

Evaluation

Evaluation 1: Heat Resistance and Out-gas

The hardmask compositions (content of compound: 10 wt %) according to Examples 1 to 4 and Comparative Examples 1 and 2 were respectively spin-on coated on a silicon wafer and heat-treated to be about 2000 Å thick at 300° C. for 5 minutes, and out-gas produced during the heat treatment was measured by using QCM (Quartz Crystal Microbalance).

The results are provided in Table 1a.

TABLE 1a

|  | Sublimate (ng) |
| --- | --- |
| Example 1 | 57 |
| Example 2 | 61 |
| Example 3 | 45 |
| Example 4 | 42 |
| Comparative Example 1 | 180 |
| Comparative Example 2 | 125 |

Referring to Table 1a, the thin films formed of the hardmask compositions according to Examples 1 to 4 showed lower outgassing than the thin films formed of the hardmask compositions according to Comparative Examples 1 and 2. Thus, the hardmask compositions according to Examples 1 to 4 showed excellent heat resistance and may be applied to a high temperature process.

The hardmask compositions (content of compound: 7 wt %) according to Examples 5 to 8 were respectively spin-on coated on a silicon wafer and heat-treated to be about 1000 Å thick at 350° C. for 5 minute, and out-gas produced during the heat treatment was measured by using QCM (Quartz Crystal Microbalance). The amount (ng) of the out-gas was calculated according to the following Calculation Equation 1.

$$\Delta mass = \frac{-\Delta freq * A * sqrt(\mu q * \rho q)}{2(Fq^2)}$$ [Calculation Equation 1]

$\Delta$mass=Mass change
$\Delta$freq=Resonant frequency change
A=Area of active surface(0.198 cm$^2$)
$\mu q$=AT-cot quartz constant(2:947×10$^{11}$ cm*s$^2$)
$\rho q$=Quartz crystal density (2.65 g/cm$^3$)
Fq=Reference frequency (9.00 MHz)

Subsequently, the hardmask compositions according to Examples 5 to 8 were used to form respective hardmask layers under the above condition. Subsequently, samples were taken from each hardmask layer and manufactured into a pellet, and a weight decrease rate of the hardmask layer for 5 minutes was measured by measuring TGA of the pellet at 350° C.

The results are provided in Table 1b.

TABLE 1b

|  | Out-gas sublimate (ng) | Weight decrease rate (%) |
| --- | --- | --- |
| Example 5 | 27 | 3.5 |
| Example 6 | 32 | 4.6 |
| Example 7 | 30 | 3.8 |
| Example 8 | 22 | 3.4 |

Referring to Table 1b, each thin film respectively formed of the hardmask compositions according to Examples 5 to 8 showed relatively low outgassing and low weight decrease rate. Thus, the hardmask compositions according to Examples 5 to 8 showed excellent heat resistance and may be applied to a high temperature process.

Evaluation 2: Etch Resistance

The hardmask compositions (content of compound: 13.0 wt %) according to Examples 1 to 4 and Comparative Example 2 were respectively spin-on coated on a silicon wafer and heat-treated to be about 4000 Å thick at 300° C. for 5 minutes. Subsequently, the hardmask layers were dry-etched respectively for 60 seconds and 100 seconds by using a $N_2/O_2$ mixed gas and a $CF_x$ gas, and then thickness of the hardmask layers were measured again. A bulk etch rate (BER) was calculated by using the thickness of the thin films before and after the dry etching and etching time according to the following Calculation Equation 2.

(Initial thin film thickness–thin film thickness after etching)/etching time (Å/s) [Calculation Equation 2]

The results are provided in Table 2a.

TABLE 2a

|  | Bulk etch rate (Å/sec) | |
| --- | --- | --- |
|  | N$_2$O$_2$ etch | CF$_x$ etch |
| Example 1 | 24.87 | 27.21 |
| Example 2 | 23.75 | 26.32 |
| Example 3 | 23.11 | 24.75 |
| Example 4 | 22.52 | 24.3 |
| Comparative Example 2 | 29.7 | 32.4 |

Referring to Table 2a, the thin films formed of the hardmask compositions according to Examples 1 to 4 showed a lower etch rate than the thin film formed of the hardmask composition according to Comparative Example 2.

Accordingly, without being bound by theory, it is believed that the hardmask compositions according to Examples 1 to 4 showed high cross-linking degree of a thin film and thus high etch resistance compared with the hardmask composition according to Comparative Example 2.

The hardmask compositions (content of compound: 15.0 wt %) according to Examples 5 to 8 and Comparative Examples 3 and 4 were respectively spin-on coated on a silicon wafer and heat-treated to be about 4000 Å thick at 350° C. for 5 minutes. Subsequently, the thin films were dry etched respectively for 60 seconds and 100 seconds by using a $N_2/O_2$ mixed gas and a $CF_x$ gas, and thickness of the thin films were measured again. A bulk etch rate (BER) was calculated by using the thickness of the thin films before and after the dry etching and etching time according to Calculation Equation 2.

The results are provided in Table 2b.

TABLE 2b

|  | Bulk etch rate (Å/sec) | |
| --- | --- | --- |
|  | $N_2O_2$ etch | $CF_x$ etch |
| Example 5 | 22.8 | 24.5 |
| Example 6 | 23.3 | 26.2 |
| Example 7 | 24.0 | 25.5 |
| Example 8 | 26.1 | 27.8 |
| Comparative Example 3 | 30.2 | 31.4 |
| Comparative Example 4 | 29.5 | 30.8 |

Referring to Table 2b, the thin films formed of the hardmask compositions according to Examples 5 to 8 showed a lower etch rate than the thin films formed of the hardmask compositions according to Comparative Examples 3 and 4.

Accordingly, without being bound by theory, it is believed that the hardmask compositions according to Examples 5 to 8 showed high cross-linking degree of a thin film and thus high etch resistance compared with the hardmask compositions according to Comparative Examples 3 and 4.

Evaluation 3: Gap-fill and Planarization Characteristics

The hardmask compositions (content of compound: 13 wt %) according to Examples 1 to 4 and Comparative Examples 1 and 2 were respectively spin-coated to be about 1700 Å thick on a patterned silicon wafer. Subsequently, the coated silicon wafers were heat-treated on a hot plate at 300° C. for 120 seconds, and a V-SEM equipment was used to observe gap-fill characteristics and planarization characteristics.

The gap-fill characteristics were evaluated by examining if a void was generated by observing cross-section of the pattern with the V-SEM equipment, and the planarization characteristics were calculated according to the following Calculation Equation 3. The planarization characteristics are better as a difference between h1 and h2 is smaller, and the smaller measurement shows better planarization characteristics.

[Calculation Equation 3]

$$\text{Planarization} = \left(1 - \frac{h_2}{h_1}\right) \times 100$$

The results are provided in Table 3a.

TABLE 3a

|  | Planarization characteristics | | Gap-fill |
| --- | --- | --- | --- |
|  | Aspect ratio (1:2) | Aspect ratio (1:15) | characteristics (void) |
| Example 1 | 4.52 | 70.23 | No void |
| Example 2 | 3.61 | 73.10 | No void |
| Example 3 | 4.38 | 79.42 | No void |
| Example 4 | 5.49 | 68.15 | No void |
| Comparative Example 1 | 13.21 | 93.48 | Void occurred |
| Comparative Example 2 | 15.83 | 99.43 | No void |

Referring to Table 3a, the thin films formed of the hardmask compositions according to Examples 1 to 4 showed excellent planarization degree and excellent gap-fill characteristics due to no observation of a void compared with the thin films formed of the hardmask compositions according to Comparative Examples 1 and 2.

The hardmask compositions (content of compound: 7.0 wt %) according to Examples 5 to 8 and Comparative Exampled 3 and 4 were respectively spin-coated to be 1,000 Å thick on a silicon wafer patterned to have an aspect ratio of 1:5. Subsequently, the coated silicon wafers were heat-treated on a hot plate at 350° C., and gap-fill characteristics and planarization characteristics were observed by using a V-SEM equipment.

Likewise, the hardmask compositions (content of compound: 10.0 wt %) according to Examples 5 to 8 and Comparative Examples 3 and 4 were respectively spin-coated to be 2,200 Å thick on a silicon wafer patterned with an aspect ratio of 1:2. Subsequently, the coated water was heat-treated on a hot plate at 350° C., and gap-fill characteristics and planarization characteristics were observed by using a V-SEM equipment.

The results are provided in Table 3b.

TABLE 3b

|  | Planarization characteristics | | Gap-fill |
| --- | --- | --- | --- |
|  | Aspect ratio = 1:5 | Aspect ratio = 1:2 | characteristics (aspect ratio = 1:5) |
| Example 5 | 23.3 | 8.8 | No void |
| Example 6 | 20.7 | 8.0 | No void |
| Example 7 | 31.5 | 9.4 | No void |
| Example 8 | 32.2 | 9.7 | No void |
| Comparative Example 3 | 46.1 | 10.5 | Void occurred |
| Comparative Example 4 | 51.1 | 9.1 | Void occurred |

Referring to Table 3b, the thin films formed of the hardmask compositions according to Examples 5 to 8 showed excellent planarization degree and excellent gap-fill characteristics due to no observation of a void under a deep pattern condition (an aspect ratio 1:5) compared with the thin films formed of the hardmask compositions according to Comparative Examples 3 and 4.

By way of summation and review, a typical lithographic technique includes providing a material layer on a semiconductor substrate; coating a photoresist layer thereon; exposing and developing the same to provide a photoresist pattern; and etching the material layer using the photoresist pattern as a mask. A hardmask layer may be formed between the material layer and the photoresist layer to provide a fine pattern. The hardmask layer plays a role of an intermediate layer for transferring the fine pattern of photoresist to the material layer through a selective etching process. A hardmask layer that provides characteristics such as heat resistance and etch resistance may better tolerate multiple etching processes. A hardmask layer may be formed by a spin-on coating method instead of, e.g., chemical vapor deposition.

The spin-on coating method is easy to perform, and may also improve gap-fill characteristics and planarization characteristics. The spin-on coating method may use a hardmask composition having solubility in a solvent, but the above characteristics desired in a hardmask layer may have a negative effect on solubility.

As described above, embodiments may provide a hardmask composition that provides heat resistance and etch resistance while providing solubility in a solvent, gap-fill characteristics, and planarization characteristics. Characteristics such as heat resistance, etch resistance, planarization characteristics, and gap-fill characteristics may be improved for the hardmask layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A hardmask composition, comprising:
a monomer represented by the following Chemical Formula 1,
a polymer including a moiety represented by the following Chemical Formula 2, a polymer including a moiety represented by the following Chemical Formula 3, or combination thereof, and
a solvent,

[Chemical Formula 1]

wherein, in Chemical Formula 1,
A is a substituted or unsubstituted aromatic ring group, a substituted or unsubstituted aliphatic cyclic group, a substituted or unsubstituted C1 to C20 alkylene group, a substituted or unsubstituted C2 to C20 alkenylene group, a substituted or unsubstituted C2 to C20 alkynylene group, or a combination thereof, provided that A does not include a coronene moiety,
A' and A" are independently a substituted or unsubstituted aromatic ring group, a substituted or unsubstituted aliphatic cyclic group, or a combination thereof,
X and X' are independently a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof,
L and L' are independently a single bond, a substituted or unsubstituted C1 to C20 alkylene group, a substituted or unsubstituted C6 to C30 arylene group, or a combination thereof, and m and n are independently integers of greater than or equal to 0, and 1≤m+n≤(a maximum number of a substituent of A),

[Chemical Formula 2]

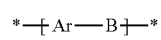

wherein, in Chemical Formula 2,
Ar is a substituted or unsubstituted aromatic group selected from the following Group 1, and
B is one or a combination of two or more selected from the following Group 2,

[Group 1]

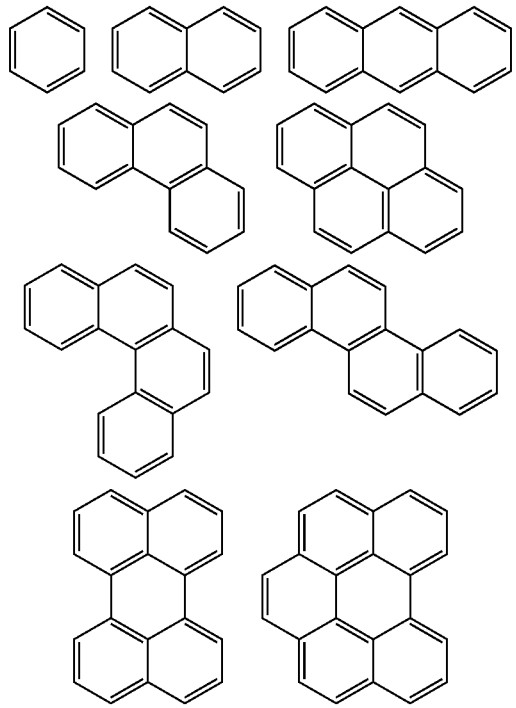

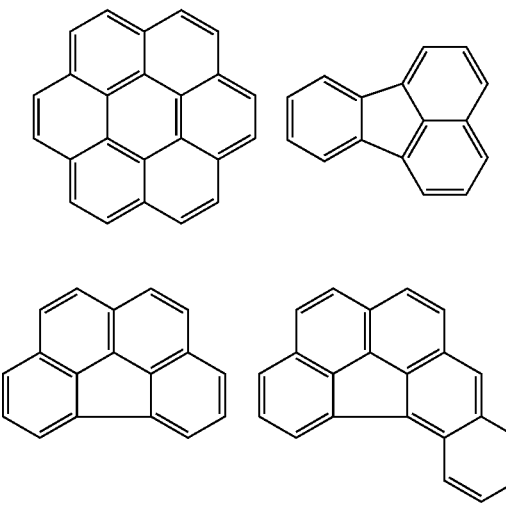

-continued
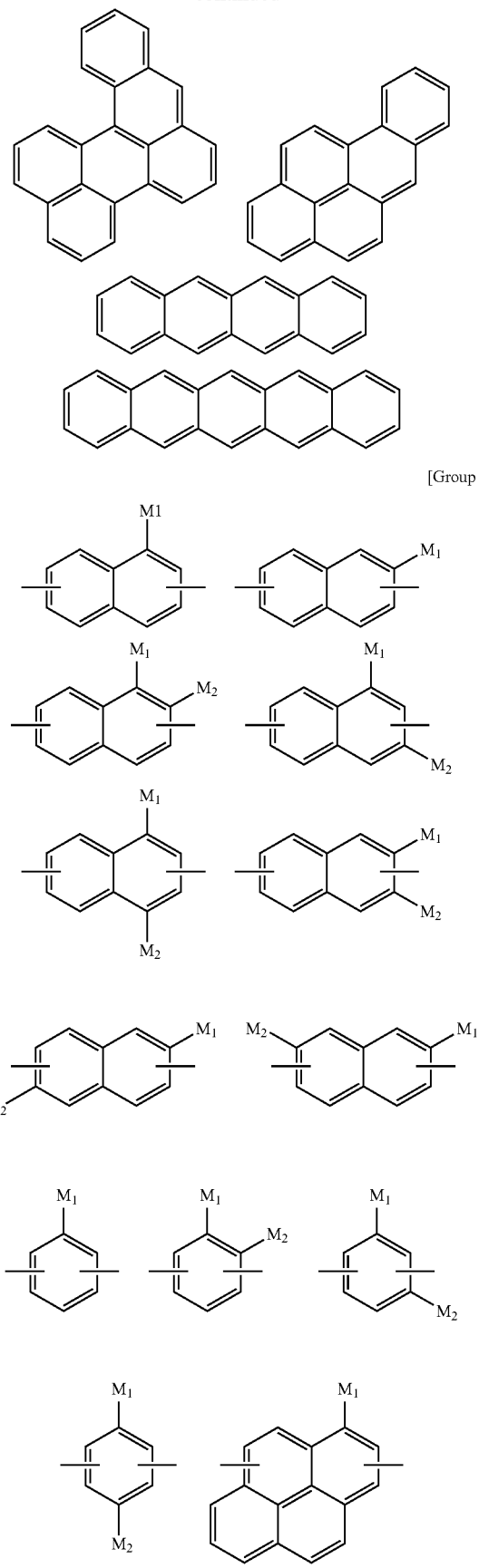
[Group 2]
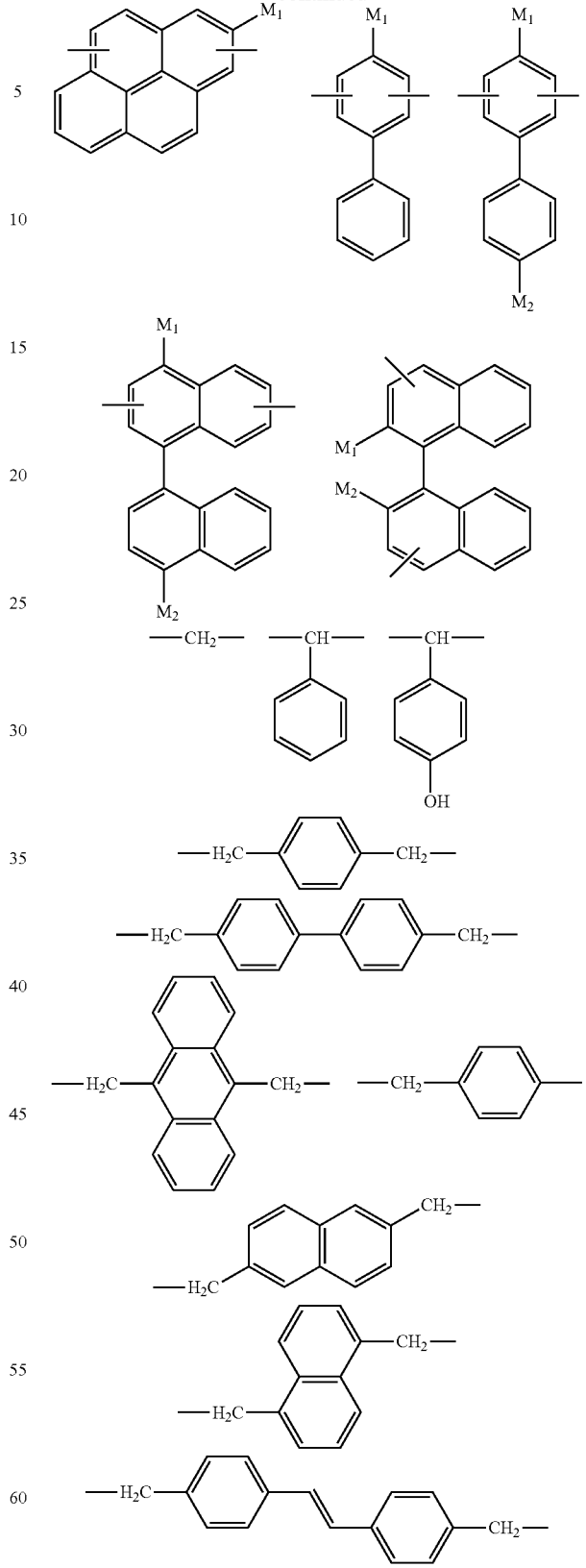
wherein, in the Group 2, $M^1$ and $M^2$ are independently hydrogen, a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof,

[Chemical Formula 3]

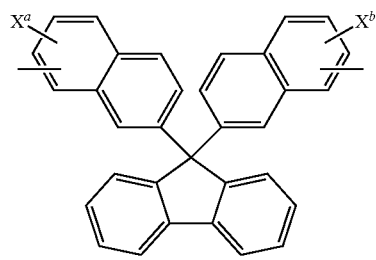

wherein, in Chemical Formula 3, $X^a$ and $X^b$ are independently a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

2. The hardmask composition as claimed in claim 1, wherein A' and A" are independently a substituted or unsubstituted cyclic group selected from the following Group 3:

[Group 3]

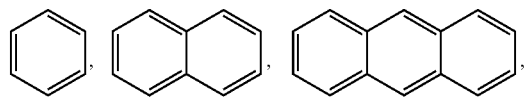

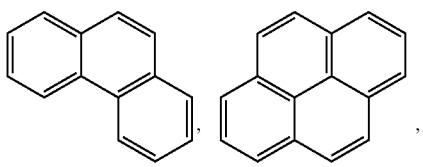

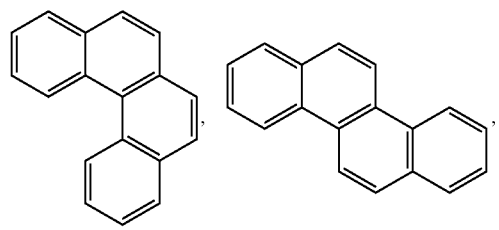

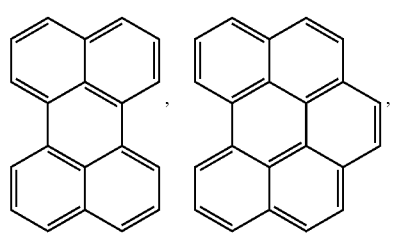

-continued

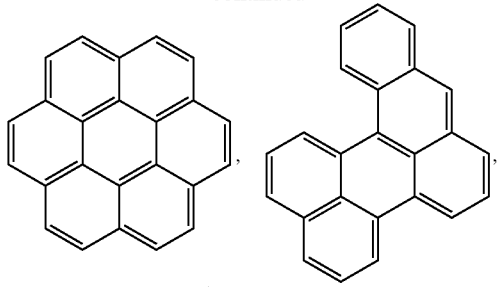

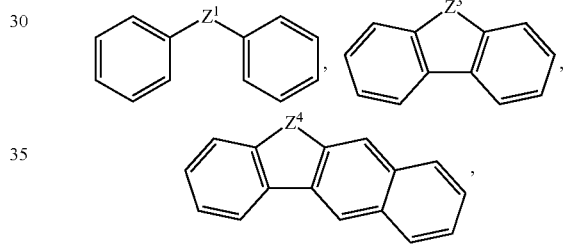

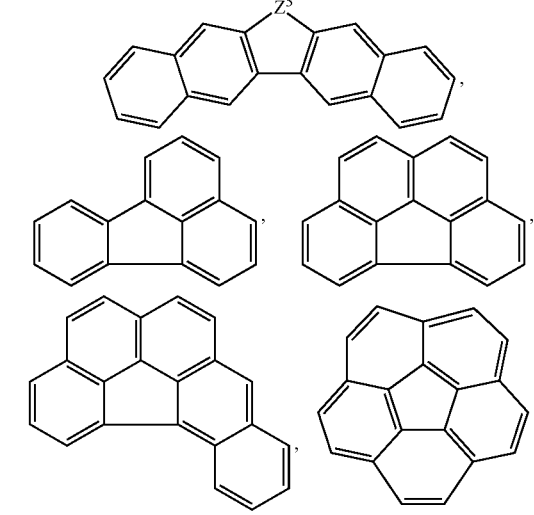

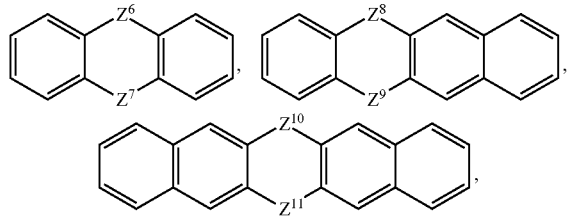

-continued

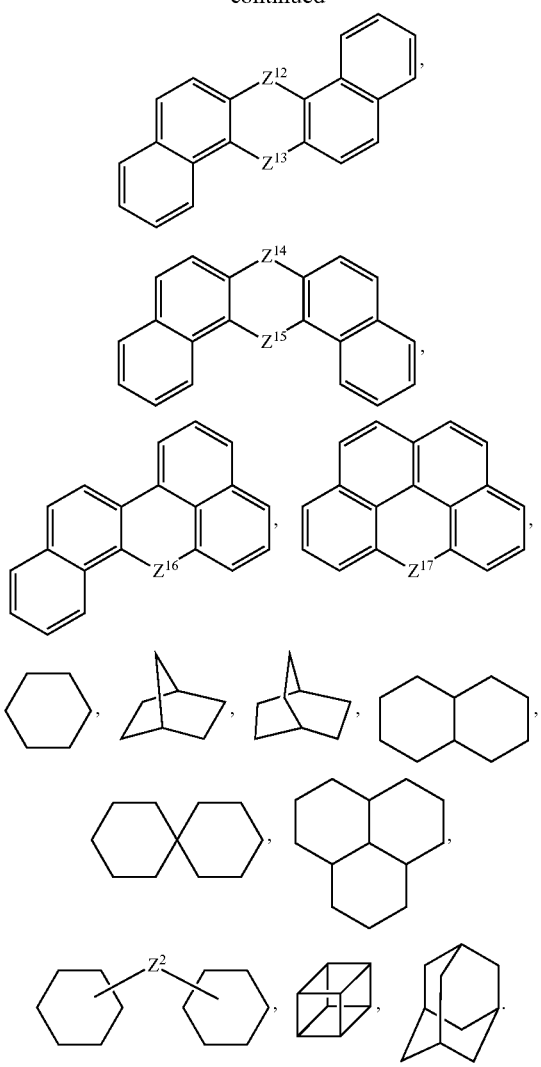

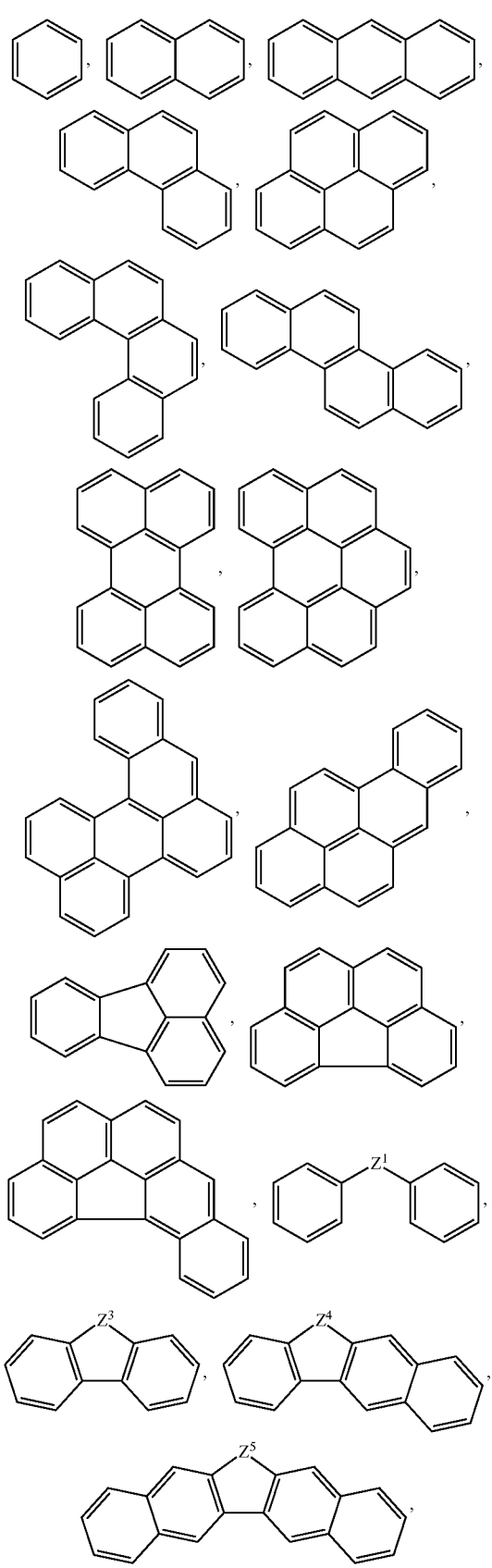

[Group 3a]

wherein, in the Group 3,

Z¹ and Z² are independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, NR$^a$, oxygen (O), sulfur (S), or a combination thereof, wherein R$^a$ is hydrogen, a substituted or unsubstituted C1 to C10 alkyl group, a halogen atom, or a combination thereof, and Z³ to Z¹⁷ are independently C=O, NR$^a$, oxygen (O), sulfur (S), CR$^b$R$^c$, or a combination thereof, wherein R$^a$ to R$^c$ are independently hydrogen, a substituted or unsubstituted C1 to C10 alkyl group, a halogen atom, a halogen-containing group, or a combination thereof, and wherein A is a substituted or unsubstituted cyclic group selected from the following Group 3a:

-continued

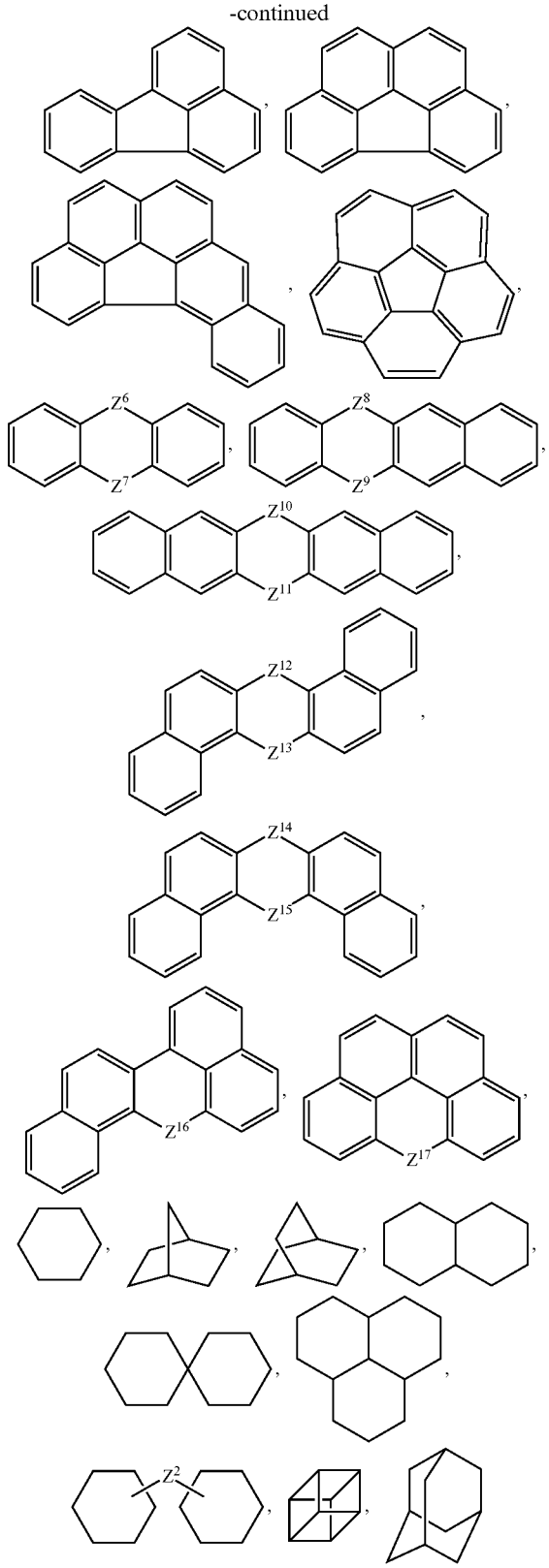

wherein, in the Group 3a,

Z¹ and Z² are independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, NR$^a$, oxygen (O), sulfur (S), or a combination thereof, wherein R$^a$ is hydrogen, a substituted or unsubstituted C1 to C10 alkyl group, a halogen atom, or a combination thereof, and Z³ to Z¹⁷ are independently C=O, NR$^a$, oxygen (O), sulfur (S), CR$^b$R$^c$, or a combination thereof, wherein R$^a$ to R$^c$ are independently hydrogen, a substituted or unsubstituted C1 to C10 alkyl group, a halogen atom, a halogen-containing group, or a combination thereof.

3. The hardmask composition as claimed in claim 2, wherein at least one of the A, A', and A" is a polycyclic aromatic group.

4. The hardmask composition as claimed in claim 1, wherein at least one hydrogen of the A, A', and A" is substituted with a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

5. The hardmask composition as claimed in claim 1, wherein the hardmask composition includes the polymer including the moiety represented by Chemical Formula 2 and, in Chemical Formula 2, at least one hydrogen of Ar is substituted with a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

6. The hardmask composition as claimed in claim 1, wherein the hardmask composition includes the polymer including the moiety represented by Chemical Formula 3, and the polymer including the moiety represented by Chemical Formula 3 further includes one or a combination of two or more selected from the following Group 4:

[Group 4]

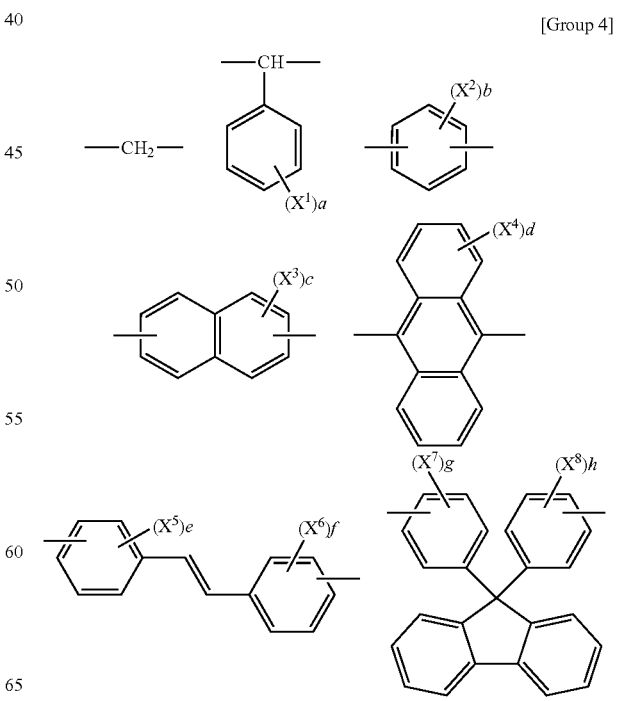

wherein, in the Group 4,

X¹ to X⁸ are independently a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof, and a to h are independently integers of 0 to 4.

7. The hardmask composition as claimed in claim 1, wherein the monomer is represented by one of the following Chemical Formulae 1a to 1d and 1f to 1h:

[Chemical Formula 1a]

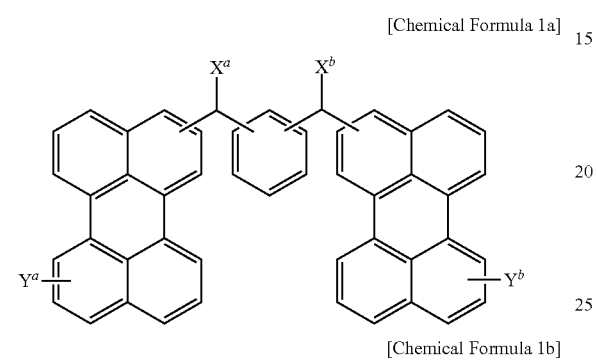

[Chemical Formula 1b]

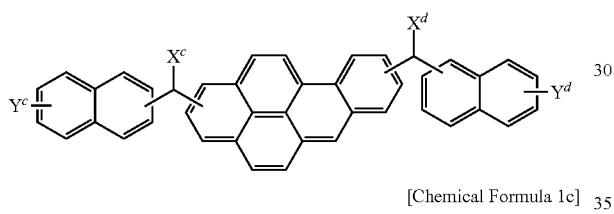

[Chemical Formula 1c]

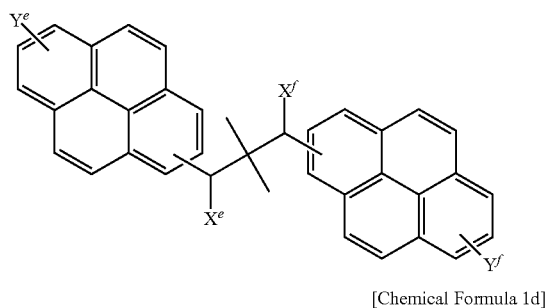

[Chemical Formula 1d]

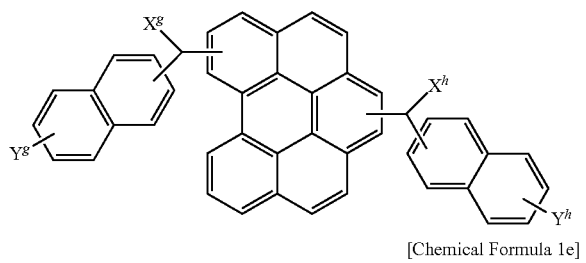

[Chemical Formula 1e]

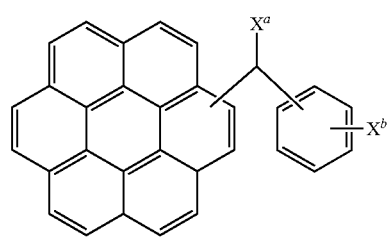

[Chemical Formula 1f]

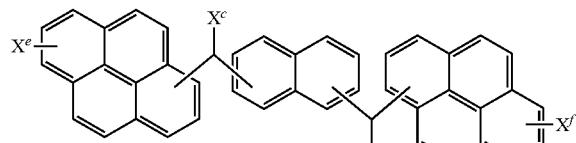

[Chemical Formula 1g]

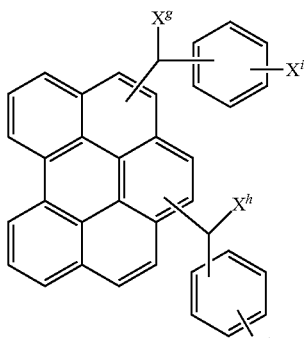

[Chemical Formula 1h]

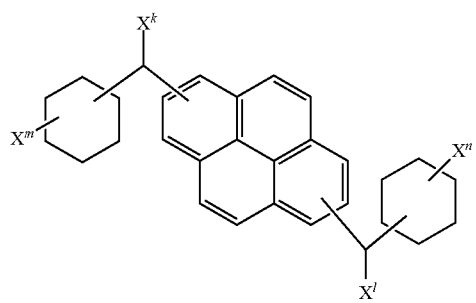

wherein, in Chemical Formulae 1a to 1d and 1f to 1h, $X^a$ to $X^n$ and $Y^a$ to $Y^h$ are independently a hydroxy group, a thionyl group, a thiol group, a cyano group, a substituted or unsubstituted amino group, a halogen atom, a halogen-containing group, a substituted or unsubstituted C1 to C30 alkoxy group, or a combination thereof.

8. The hardmask composition as claimed in claim 1, wherein the monomer has a molecular weight of about 200 to about 5,000.

9. The hardmask composition as claimed in claim 1, wherein the polymer including the moiety represented by Chemical Formula 2 and the polymer including the moiety represented by Chemical Formula 3 each have a weight average molecular weight of about 500 to about 10,000.

10. The hardmask composition as claimed in claim 1, wherein a weight ratio of the monomer to the polymer is about 9:1 to about 1:9.

11. The hardmask composition as claimed in claim 1, wherein the solvent includes at least one selected from propylene glycol monomethylether acetate (PGMEA), propylene glycol monomethylether (PGME), cyclohexanone, and ethyl lactate.

12. The hardmask composition as claimed in claim 1, wherein the monomer and the polymer are included in an amount of about 0.1 parts by weight to about 50 parts by weight based on 100 parts by weight of the solvent.

13. A method of forming a pattern, the method comprising:

providing a material layer on a substrate,
applying the hardmask composition of claim 1 on the material layer,
heat-treating the hardmask composition to form a hardmask layer,
forming a silicon-containing thin layer on the hardmask layer,
forming a photoresist layer on the silicon-containing thin layer,
exposing and developing the photoresist layer to form a photoresist pattern,
selectively removing the silicon-containing thin layer and the hardmask layer using the photoresist pattern to expose a part of the material layer, and
etching an exposed part of the material layer.

14. The method as claimed in claim 13, wherein the hardmask composition is applied using a spin-on coating method.

15. The method as claimed in claim 13, wherein the process of forming a hardmask layer includes heat-treating at about 100° C. to about 500° C.

16. The method as claimed in claim 13, further comprising forming a bottom antireflective coating (BARC) on the silicon-containing thin layer.

17. The method as claimed in claim 16, wherein the silicon-containing thin layer comprises silicon oxynitride (SiON).

18. A semiconductor integrated circuit device, comprising a pattern formed using the method as claimed in claim 13.

* * * * *